United States Patent
Shim et al.

(10) Patent No.: US 9,941,016 B2
(45) Date of Patent: Apr. 10, 2018

(54) FLASH MEMORY DEVICE PERFORMING ADAPTIVE LOOP, MEMORY SYSTEM AND METHOD OF OPERATING THE MEMORY SYSTEM

(71) Applicant: SAMSUNG ELECTRONICS CO., LTD., Suwon-si, Gyeonggi-do (KR)

(72) Inventors: Young-Seop Shim, Seoul (KR); Jae-Hong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/065,920

(22) Filed: Mar. 10, 2016

(65) Prior Publication Data

US 2016/0371026 A1 Dec. 22, 2016

(30) Foreign Application Priority Data

Jun. 22, 2015 (KR) ........................ 10-2015-0088722

(51) Int. Cl.
| | |
|---|---|
| *G11C 16/34* | (2006.01) |
| *G11C 16/16* | (2006.01) |
| *G11C 7/04* | (2006.01) |
| *G11C 16/10* | (2006.01) |
| *G11C 11/56* | (2006.01) |

(52) U.S. Cl.
CPC ............ *G11C 16/3495* (2013.01); *G11C 7/04* (2013.01); *G11C 16/10* (2013.01); *G11C 16/16* (2013.01); *G11C 16/349* (2013.01); *G11C 16/3445* (2013.01); *G11C 16/3459* (2013.01); *G11C 11/5628* (2013.01); *G11C 11/5635* (2013.01)

(58) Field of Classification Search
CPC .... G06F 3/0619; G06F 3/0655; G06F 3/0688; G11C 7/04; G11C 11/5628; G11C 11/5635; G11C 16/10; G11C 16/16; G11C 16/3445; G11C 16/3459; G11C 16/3495
See application file for complete search history.

(56) References Cited

U.S. PATENT DOCUMENTS

| | | | |
|---|---|---|---|
| 7,173,862 | B2 | 2/2007 | Futatsuyama et al. |
| 7,230,854 | B2 * | 6/2007 | Wan .................... G11C 11/5628 365/185.18 |
| 7,423,904 | B2 | 9/2008 | Kojima |
| 7,830,720 | B2 | 11/2010 | Lee et al. |
| 7,876,623 | B2 | 1/2011 | Ha |

(Continued)

FOREIGN PATENT DOCUMENTS

| | | |
|---|---|---|
| JP | 2008262623 | 10/2008 |
| KR | 1020070109684 | 11/2007 |
| KR | 1020080090801 | 10/2008 |

*Primary Examiner* — Vanthu Nguyen
(74) *Attorney, Agent, or Firm* — Volentine & Whitt, PLLC

(57) ABSTRACT

A method of operating a flash memory device includes detecting the number of program/erase cycles that have been executed by the flash memory device. A setting value related to the number of times a program loop is performed is changed according to the detected number of program/erase cycles. Data is programmed within the flash memory by performing the program loop one or more times, in response to receiving a write command. A determination is made whether the programming has passed or failed, based on whether the number of program loops required to program the data within the flash memory is within a boundary identified by the changed setting-value.

18 Claims, 27 Drawing Sheets

(56) References Cited

U.S. PATENT DOCUMENTS

| | | | |
|---|---|---|---|
| 8,130,551 B2 * | 3/2012 | Oowada | G11C 11/5635 |
| | | | 365/185.19 |
| 8,305,804 B2 | 11/2012 | Kim et al. | |
| 8,605,504 B2 * | 12/2013 | Okamoto | G06F 12/0246 |
| | | | 365/185.09 |
| 8,848,450 B2 | 9/2014 | Kang et al. | |
| 8,995,200 B1 * | 3/2015 | Mu | G11C 7/08 |
| | | | 365/185.2 |
| 9,042,181 B2 * | 5/2015 | Flynn | G11C 16/14 |
| | | | 365/185.18 |
| 9,047,962 B2 * | 6/2015 | Ishii | G11C 16/0483 |
| 9,105,336 B2 * | 8/2015 | Shiino | G11C 16/10 |
| 9,214,240 B2 * | 12/2015 | Dutta | G11C 16/14 |
| 9,418,000 B2 * | 8/2016 | Raghunathan | G11C 29/021 |
| 9,455,044 B2 * | 9/2016 | Joo | G11C 16/3459 |
| 2012/0020166 A1 | 1/2012 | Ishii | |
| 2014/0198581 A1 | 7/2014 | Kim et al. | |

\* cited by examiner

FLASH MEMORY DEVICE PERFORMING ADAPTIVE LOOP, MEMORY SYSTEM AND METHOD OF OPERATING THE MEMORY SYSTEM

CROSS-REFERENCE TO RELATED APPLICATION

This application claims the benefit of Korean Patent Application No. 10-2015-0088722, filed on Jun. 22, 2015, in the Korean Intellectual Property Office, the disclosure of which is incorporated herein in its entirety by reference.

BACKGROUND

The disclosure relates to a flash memory device, and more particularly, to a flash memory device performing an adaptive loop, a memory system, and a method of operating the memory system.

A non-volatile memory device, such as a semiconductor memory device, includes a plurality of memory cells that store data in a non-volatile manner. A flash memory device, as an example of the non-volatile memory device, may be used in a mobile phone, a digital camera, a personal digital assistant (PDA), a mobile computing device, a fixed type computing device, or other devices.

Data reliability of the flash memory device may be deteriorated due to a progressive defect. For example, the flash memory device may have various types of bridges between word lines, between a word line and a channel, and between a word line and a common source line due to its structure, and a progressive defect may occur in the flash memory device due to the bridges. Accordingly, it is necessary to secure the reliability of data against the progressive defect.

SUMMARY

The disclosure describes a flash memory device performing an adaptive loop, which may improve the reliability of data against a progressive defect, a memory system, a method of operating the flash memory device, and a method of operating the memory system.

According to an aspect of the disclosure, there is provided a method of operating a flash memory device that includes detecting the number of program/erase cycles that have been executed by the flash memory device. A setting value related to the number of times a program loop is performed is changed according to the detected number of program/erase cycles. Data is programmed within the flash memory by performing the program loop one or more times, in response to receiving a write command. A determination is made whether the programming has passed or failed, based on whether the number of program loops required to program the data within the flash memory is within a boundary identified by the changed setting-value.

According to another aspect of the disclosure, there is provided a method of operating a memory system comprising a memory controller and a memory device. The method includes detecting the number of program/erase cycles that have been executed by the memory device. A maximum number of loops of a program operation or an erase operation is changed according to the detected number of program/erase cycles. A determination is made of whether a memory operation has passed or failed, based on whether the number of program loops required to program or erase data within the flash memory exceeds the changed, maximum number of loops. A cell region, for which the memory operation is requested, is managed as a bad region if the memory operation is determined to have failed.

According to another aspect of the disclosure, there is provided a method executed by a nonvolatile memory device of programming or erasing data within the nonvolatile memory device. The method includes selecting a boundary that varies in accordance with a parameter of the nonvolatile memory device. Operational loops for programming or erasing data within the nonvolatile memory device are executed. A determination is made whether the data is successfully programmed or erased within the nonvolatile memory device through a number of the executed operational loops that is within the selected boundary

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Figure 1:
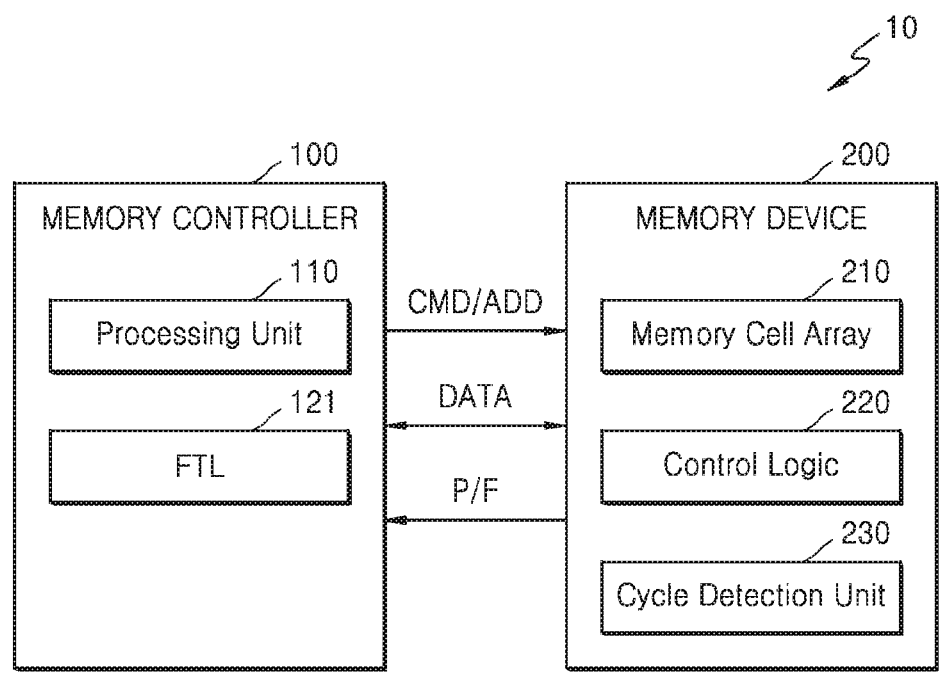
FIG. 1 is a block diagram of a memory system according to an exemplary embodiment of the disclosure.

The present disclosure will now be described more fully with reference to the accompanying drawings, in which exemplary embodiments of the disclosure are shown. The disclosure may, however, be embodied in many different forms, and should not be construed as being limited to the embodiments set forth herein. Thus, the disclosure may include all revisions, equivalents, or substitutions which are included in the concept and the technical scope related to the present disclosure. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify the existence of a recited form, a number, a process, an operation, a component, and/or groups thereof, not to exclude the existence of one or more other recited forms, one or more other numbers, one or more other processes, one or more other operations, or one or more other components and/or groups thereof.

Unless expressly described otherwise, all terms including descriptive or technical terms which are used herein should be construed as having meanings that are obvious to one of ordinary skill in the art.

Also, terms that are defined in a general dictionary and that are used in the following description should be construed as having meanings that are equivalent to meanings used in the related description, and unless expressly described otherwise herein, the terms should not be construed as being ideal or excessively formal. As used herein, the term "and/or" includes any and all combinations of one or more of the associated listed items.

FIG. 1 is a block diagram of a memory system 10 according to an exemplary embodiment of the disclosure.

Referring to FIG. 1, the memory system 10 may include a memory controller 100 and a memory device 200. The memory controller 100 performs a control operation on the memory device 200. For example, the memory controller 100 may provide an address ADD and a command CMD to the memory device 200, and thus may control write (program), read, and erase operations with respect to the memory device 200. Also, data DATA for the program operation and read data DATA may be exchanged between the memory controller 100 and the memory device 200.

The memory device 200 may include a memory cell array 210, a control logic 220, and a cycle detection unit 230. The memory cell array 210 may include a plurality of memory cells that are disposed in areas where a plurality of word lines and a plurality of bit lines cross. The memory cell array 210 may include a plurality of non-volatile memory cells that store data in a non-volatile manner. For example, the memory cell array 210 may include, as the non-volatile memory cells, flash memory cells such as NAND flash memory cells and NOR flash memory cells. Hereinafter, one or more exemplary embodiments of the disclosure are described in detail under the assumption that the memory cell array 210 includes flash memory cells, so that the memory device 200 is a flash memory device.

The memory controller 100 may include a processing unit 110 and a flash transformation layer (FTL) 121. The FTL 121 may include system software (or firmware) that performs management for write, read, and erase operations of a flash memory device, and may be loaded in a working memory (not shown) and be driven by the processing unit 110.

The processing unit 110 may control the overall operation of the memory controller 100. The FTL 121 may transform a logical address into a physical address and provide the physical address to the memory device, according to a request for data access from a host. In addition, the FTL 121 performs a management operation for various cell regions (for example, a chip unit cell region, a block unit cell region, and a page unit cell region) included in the memory cell array 210. For example, the FTL 121 processes a cell region having characteristics deteriorated due to a progressive defect as a bad region, and thus prevents data from being written to the cell region having the degraded characteristics.

The memory cell array 210 may be variously embodied, and for example, the memory cell array 210 may include three-dimensional (3D) (or vertical) NAND (VNAND) memory cells. When the memory device 200 includes a plurality of flash memory chips, the memory cell array 210 may be defined as a memory cell array which includes memory cells and is provided in the plurality of flash memory chips. Also, the memory cell array 210 may include a plurality of blocks, and each of the blocks may include a plurality of pages. For example, the block may be an erase unit of the memory device 200, and the page may be a program/read unit of the memory device 200.

The memory device 200 may perform program and erase operations according to the control of the memory controller 100. The memory device 200 performs a data program operation according to a write command from the memory controller 100. The memory device 200 may perform the data program operation by performing a program loop multiple times. Program voltages in the program loops may be different from one another. For example, the number of times the program loop is performed increases according to an incremental step pulse program method, and a program voltage may gradually increase as the number of times the program loop is performed increases.

The memory device 200 may perform an erase operation in block units according to an erase command from the memory controller 100. The memory device 200 may perform a data erase operation by performing an erase loop multiple times. Erase voltages in the erase loops may be different from one another. For example, the number of times the erase loop is performed may increase according to an incremental step pulse erase method, and an erase voltage may gradually increase as the number of times the erase loop is performed increases.

In the memory system 10 according to the current exemplary embodiment, the memory device 200 may detect a program/erase cycle and change set values related to program and erase operations based on the detection result. A method of detecting the program/erase cycle may be variously embodied, and for example, the program/erase cycle may be detected by performing a counting operation in response to the reception of a write command or erase command from the memory controller 100. Hereinafter, an operation of detecting a program/erase cycle according to an exemplary embodiment of the disclosure may be defined as including any of various methods, such as performing a counting operation in response to the reception of a write command, performing a counting operation in response to the reception of an erase command, and performing a counting operation in response to the reception of a write/erase command.

As an example of changing set values, the number of times a program loop is performed may be changed depending on a result obtained by detecting a program/erase cycle, and for example, a maximum value (i.e., maximum number of program loops) and/or a minimum value (i.e., minimum number of program loops) of the number of times a program loop is performed may be changed. In addition, the number of times an erase loop is performed may be changed depending on a result obtained by detecting a program/erase cycle, and for example, a maximum value (i.e., maximum number of erase loops) and/or a minimum value (i.e., minimum number of erase loops) of the number of times an erase loop is performed may be changed.

When set values related to the number of times a program loop is performed are changed, a program loop is performed depending on the changed set values when performing a program operation in response to a write command from the memory controller 100. For example, when a maximum value of the number of times a program loop is performed is set to M (where M is a positive integer), the memory device 200 performs a program loop including data program and verification equal to or less than M times. If it is determined that data is normally written by performing a program loop equal to or less than M times, a program operation corresponding to the program loop may be determined as having passed. On the other hand, if it is determined that data is not normally written while performing the program loop M times, the program loop is no longer performed and a program operation corresponding to the program loop may be determined as having failed.

Similar to the program operation, an erase operation may also be performed based on changed set values. For example, an erase loop may be performed on an erase-requested block (for example, a block to be erased in response to an erase command from the memory controller 100). When a maximum value of the number of times an erase loop is performed is set to N (where N is a positive integer), the memory device 200 may perform an erase loop including data erase and verification. If it is determined that data is normally erased by performing an erase loop equal to or less than N times, an erase operation corresponding to the erase loop may be determined as having passed. On the other hand, if it is determined that data is not normally erased by performing the erase loop N times, the erase loop is no longer performed and an erase operation corresponding to the erase loop may be determined as having failed.

When the program operation and the erase operation are determined as having failed, the memory system 10 may perform a management operation for a corresponding cell region. For example, the memory device 200 may provide pass/fail information (P/F) indicating a pass or a fail to the memory controller 100 based on the result obtained by performing a program or erase operation. When a program fail occurs with respect to a write-requested cell region (for example, a write-requested page to be written to in response to a write command from the memory controller 100), the memory controller 100 may control the memory device 200 so that data is written to another page other than the write-requested page. For example, the FTL 121 may write data from a host (not shown) into another page by converting mapping information between a logical address and a physical address.

Alternatively, the memory controller 100 may process a block (for example, a first block), which includes a page in which a program fail occurs, as a bad block. If valid data exists in the first block, the valid data may be moved to another block (for example, a second block) and write-requested data may be written to the second block.

When an erase fail occurs with respect to an erase-requested cell region (for example, an erase-requested block to be erased in response to an erase command from the memory controller 100), the memory controller 100 may manage a block corresponding to the erase fail as a bad block. For example, the FTL 121 may store information of an erase-failed block and prevent data from being written to the erase-failed block.

As the number of program/erase cycles increases, characteristics of flash memory cells may vary, and for example, the number of loops in which a program operation and an erase operation are determined as having failed may statistically vary. According to an exemplary embodiment as described above, since set values related to the number of times a program/erase loop is performed are changed to adapt to a characteristic variation of flash memory cells, program and erase operations may be performed as loops optimized for the flash memory cells. In addition, since a cell region in which there is a high possibility that the reliability of the cell region is degraded due to a progressive defect or the like is processed as a bad region in advance, data loss, which may occur by writing data into the cell region in which the reliability may be degraded, may be prevented.

Operations according to an exemplary embodiment of the disclosure may be explained as follows. For convenience of explanation, a maximum value of the number of times a program/erase loop is performed will be mainly explained in the case of changing the number of times a program/erase loop is performed. However, the disclosure is not limited thereto, and a minimum value of the number of times a program/erase loop is performed may be changed. In addition, both a maximum value and a minimum value of the number of times a program/erase loop is performed may be changed. For convenience of explanation, changing the number of times a program/erase loop is performed may be defined as changing the number of times a program loop is performed or changing the number of times an erase loop is performed. In addition, changing the number of times a loop is performed may be defined as changing both the number of times a program loop is performed and the number of times an erase loop is performed.

Figure 2A:
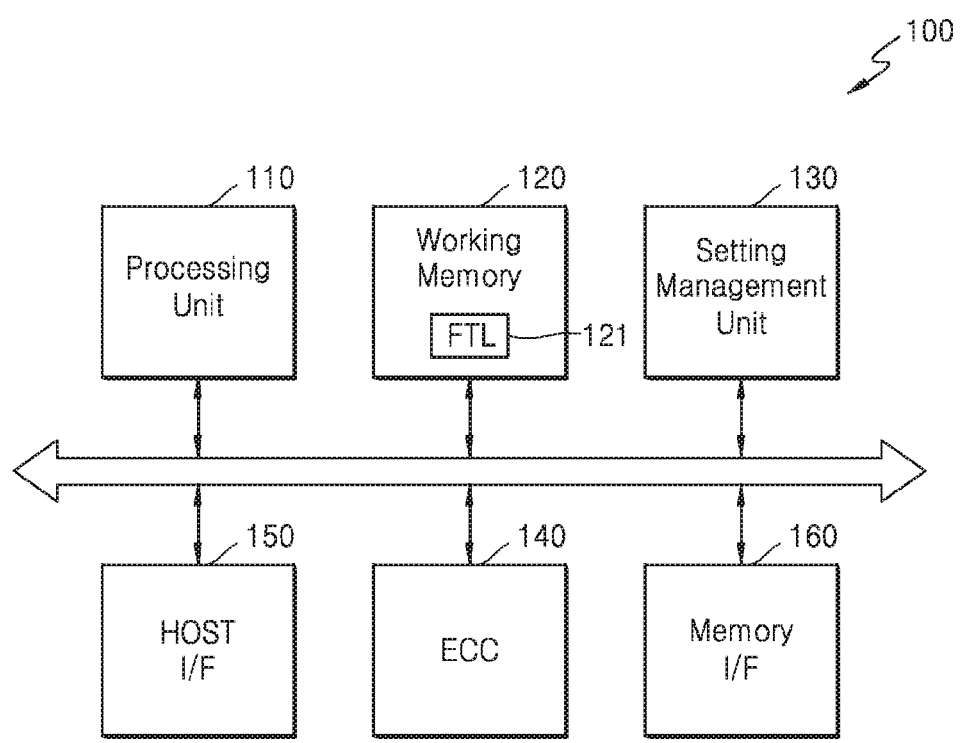
FIGS. 2A and 2B are block diagrams of an example of a memory controller of FIG. 1, according to an exemplary embodiment of the disclosure.
Figure 2B:
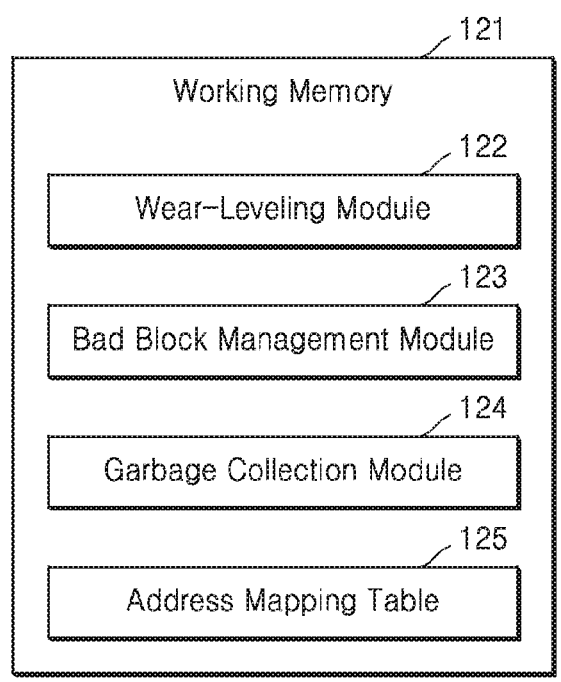

FIGS. 2A and 2B are block diagrams of an example of the memory controller 100 of FIG. 1, according to an exemplary embodiment of the disclosure.

Referring to FIGS. 2A and 2B, the memory controller 100 may include a processing unit 110, a working memory 120, a setting management unit 130, an error correction unit 140, a host interface 150, and a memory interface 160. An FTL 121 may be loaded in the working memory 120. As described above, the FTL 121 may include firmware. Depending on a function implemented in the firmware, the FTL 121 may include a wear-leveling module 122, a bad block management module 123, a garbage collection module 124, and an address mapping table 125.

Although not shown in FIGS. 2A and 2B, the memory controller 100 may further include various elements, for example, a read only memory (ROM) for storing data code necessary for initially booting a device employing a memory system or a buffer memory controller for controlling a buffer memory device. The memory controller 100 may further include a command generating module (not shown) for generating a command CMD used to control a memory operation according to a request from a host.

The processing unit 110 may include a central processing unit or a microprocessor and may control the overall operation of the memory controller 100. The processing unit 110 may drive the firmware loaded in the working memory 120 to control the memory controller 100. The memory controller 100 may be configured to communicate with an external host through various standard interfaces. The host interface 150 provides an interface between the host and the memory controller 100. The standard interfaces may include an advanced technology attachment (ATA), a serial-ATA (SATA), an external SATA (e-SATA), a small computer system interface (SCSI), a serial attached SCSI (SAS), a peripheral component interconnection (PCI), a PCI express (PCI-E), IEEE 1394, a universal serial bus (USB), a secure digital (SD) card, a multi media card (MMC), an embedded multimedia card (eMMC), a universal flash storage (UFS), a compact flash (CF) card interface, etc.

The memory interface 150 may provide an interface between the memory controller 100 and a memory device 200. For example, write data and read data may be transmitted to and received from the memory device 200 through the memory interface 150. The memory interface 150 may provide a command CMD and an address ADD to the memory device 200, receive various pieces of information from the memory device 200, and provide the various pieces of information to the memory controller 100.

The firmware for controlling the memory controller 100 and metadata necessary for driving the firmware may be stored in the working memory 120. The working memory 120 may be implemented with various memories, for example, at least one selected from cache memory, a dynamic random-access memory (DRAM), a static RAM (SRAM), a phase change RAM (PRAM), and flash memory devices.

The wear-leveling module 122 manages wear-levels of memory cells of the memory device 200. The memory cells may age according to a frequency of write and erasure operations. An aged memory cell (or a worn memory cell) may cause a defect. The wear-leveling module 122 manages program and erase cycles for a memory cell, thereby preventing a specific cell region from being worn faster than another cell region. As an example, the wear-leveling module 122 may manage the address mapping table 125 such that the number of program and erase operations is equally granted to cell regions of the memory cell array.

The bad block management module 123 manages a block in which the defect occurs among a plurality of blocks provided in the memory device 200. For example, as described above, as the number of program/erase cycles increases, a set value of the number of times a program/erase loop is performed may be changed, and a block in which a program fail or an erase fail occurs may be processed as a bad block based on the changed set-value. The bad block management module 123 may manage the address mapping table 125 such that the block processed as the bad block is prevented from having data written thereto.

The garbage collection module 124 may manage blocks in which fragmented data is stored. For example, an erasure unit is set to be greater than a program unit in a flash memory device, and a job of collecting continuous data scattered in physically different locations to a same address region by using an arbitrary free block after repeating program and erase operations may be performed. A free block may be generated according to the operation of the garbage collection module 124.

The address mapping table 125 may store mapping information between a logical address from a host and a physical address indicating a physical location in which data is to be actually accessed in response to the logical address. By referring to the mapping information, the logical address provided from the host may be converted into the physical address indicating the physical location of a memory cell to be actually accessed. According to an exemplary embodiment of the disclosure, program fail-processed data (e.g., data which was unable to be processed within a set number of program loops) may be stored in another cell region (for example, a page) of the memory device 200, and in this case, mapping information between the logical address and the physical address may be changed. Changed mapping information may be updated to the address mapping table 125.

In the address mapping table 125, the mapping information may be changed based on a result obtained by managing various function blocks described above. For example, data written to memory cells having increased wear-levels or memory cells processed as bad blocks may be moved to normal memory cells, and thus, mapping information between a logical address and a physical address may be changed. After data is moved by a garbage collection operation, the mapping information between the logical address and the physical address may be changed.

The setting management unit 130 may manage various settings related to a memory operation of the memory device 200 during an initial operation of the memory system 10. For example, a result of cycle detection performed in the memory device 200 may be provided to the memory controller 100, and the setting management unit 130 may perform settings related to the number of times a program/erase loop is performed in the memory device 200 based on the result of cycle detection. For example, the result of cycle detection is compared with one or more reference values, and it is determined whether it is necessary to change the settings related to the number of times a program/erase loop is performed, according to a result of the comparison. The setting management unit 130 may manage the memory device 200 so that maximum and minimum values of the number of times a program/erase loop is performed are changed based on a result of the determination. The error correction unit 140 may perform an error detection and correction operation on data DATA provided from the memory device 200. As another exemplary embodiment, an error detection and correction function may be provided in the memory device 200.

Figure 3:
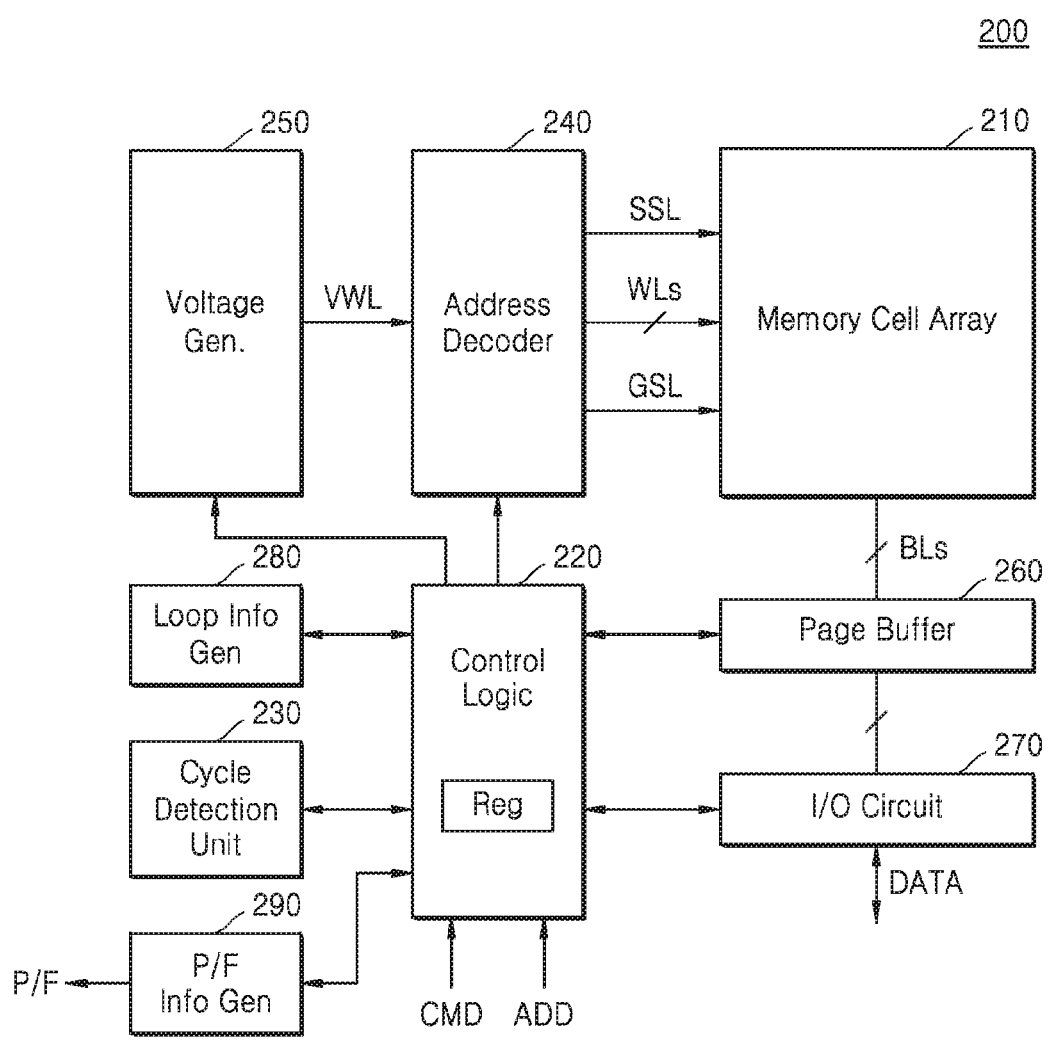
FIG. 3 is a block diagram of an example of a memory device of FIG. 1, according to an exemplary embodiment of the disclosure.

FIG. 3 is a block diagram of an example of the memory device 200 of FIG. 1, according to an exemplary embodiment of the disclosure. As shown in FIG. 3, the memory device 200 may include a memory cell array 210, a control logic 220, and a cycle detection unit 230. Also, the memory device 2000 may further include a row decoder 240, a voltage generator 250, a page buffer 260, an input/output circuit 270, a loop information generator 280, and a pass/fail information generator 290.

The memory cell array 210 may be connected to one or more string selection lines SSL, a plurality of word lines WLs (including normal word lines and dummy word lines), and one or more ground selection lines GSL, and may be connected to a plurality of bit lines BLs. The voltage generator 250 may generate one or more word lines voltages VWL, and the word line voltages VWL may be provided to the address decoder 240. Data DATA to be written may be provided via the input/output circuit 270 and thus may be temporally stored in the page buffer 260. Data DATA that is read may be provided to the outside via the page buffer 260 and the input/output circuit 270. The control logic 260 may provide various control signals related to the memory operation to the address decoder 240, the voltage generator 250, and other various function blocks.

According to an exemplary embodiment, the memory device 200 may detect a program/erase cycle and change a setting value related to the number of times a program/erase loop is performed, according to a result of the detection. When a received command CMD corresponds to a write request or an erase request, the cycle detection unit 230 may detect a program/erase cycle based on a counting operation and provide a result of the detection.

The control logic 220 may change the setting value related to the number of times a program/erase loop is performed, based on a result of the cycle detection. As an exemplary embodiment, the control logic 220 may include a register Reg for storing the setting value related to the number of times a program/erase loop is performed. The register Reg may store information about a maximum value and a minimum value of the number of times a program/erase loop will performed during program/erase operations. The control logic 220 may perform a program operation and an erase operation of the memory device 200, based on information stored in the register Reg.

The loop information generator 280 may store various pieces of information related to the number of times a program/erase loop is performed. As an exemplary embodiment, the loop information generator 280 may include a look-up table (LUT) that stores information related to the maximum value and the minimum value of the number of times a program/erase loop is performed, according to the increase of the number of program/erase cycles. The control logic 220 may change the setting value related to the number of times a program/erase loop is performed, by using a detection result from the cycle detection unit 230 and information of the loop information generator 280, and may store a changed setting-value in the register Reg.

As another exemplary embodiment, the loop information generator 280 may be implemented with any of various methods. For example, the loop information generator 280 may calculate the maximum value and the minimum value of the number of times a program/erase loop is performed, by performing a predetermined arithmetic operation. The control logic 220 may provide a detection result from the cycle detection unit 230 to the loop information generator 280, and the loop information generator 280 may apply the detection result to a predetermined arithmetic equation and calculate the maximum value and the minimum value of the number of times a program/erase loop is performed. The control logic 220 may store a calculated setting value of the number of times a program/erase loop is performed, and then may perform a program operation and an erase operation based on a setting value changed during write and erase operations.

The control logic 220 may perform program and erase operations based on the changed setting-value, and may determine whether the program operation has passed or failed and whether the erase operation has passed or failed, based on a result of performing the program and erase operations. A result of the determination may be provided to the pass/fail information generator 290, and the pass/fail information generator 290 may provide information P/F indicating whether the program operation has passed or failed or whether the erase operation has passed or failed, based on the result of the determination.

According an exemplary embodiment of the disclosure, an example of changing a setting value of the number of times a program/erase loop is performed, according to a result obtained by detecting a program/erase cycle, is explained below. For convenience of explanation, an example of detecting a program cycle and changing a maximum value of the number of times a program loop is performed is explained.

In a flash memory device, memory cells have characteristics in which the amount of change in a threshold voltage, which is caused by one program loop, increases when the number of program cycles increases, due to physical characteristics of the memory cells. As an example, when data is programmed by using a constant program voltage in a state in which a program cycle corresponds to 3 k, the amount of increase in the threshold voltage is greater than in a state in which the program cycle corresponds to 1 k. For example, when it is assumed that data is normally written to most memory cells through performing a program loop less than 4 times in the state in which the number of program cycles corresponds to 3 k, a program loop needs to be performed 5 or more times to normally write data into memory cells in the state in which the number of program cycles corresponds to 1 k.

From a different viewpoint, when data is not normally written to one or more memory cells even though a program loop is performed 4 times in a state in which the number of program cycles corresponds to 3 k, a cell region corresponding to the one or more memory cells corresponds to a region having relatively deteriorated characteristics, and there is a high possibility that data of the cell region is lost due to progressive defects. Accordingly, when data is not normally written to the memory cells even after the program loop is performed 4 times, the cell region corresponding to the memory cells may be processed as a bad region.

On the other hand, when the program cycle corresponds to 1 k, the amount of increase in the threshold voltage, which is caused by each program loop, is relatively small, and thus, even though data is not normally written to memory cells in a state in which the program loop is performed 4 times, it is not necessary to determine that the memory cells have deteriorated characteristics. Accordingly, a program operation may be completed by further repeating the program loop. If a maximum number of times the program loop may be performed in a state in which the program cycle corresponds to 1 k is set to 7, a cell region may be processed as a bad region when data is not normally written to memory cells of the cell region even after the program loop is performed 7 times.

In consideration of characteristics as described above, the setting value may be changed so that as the number of program cycles increases, the maximum value of the number of times a program/erase loop is performed decreases. The control logic 220 may determine the current program cycle according to a detection result from the cycle detection unit 230, and may change the maximum value corresponding to the current program cycle, based on information stored in the loop information generator 280.

In connection with an erase operation, memory cells of the flash memory device have characteristics in which the amount of change in a threshold voltage, which is caused by one erase loop, decreases when the number of erase cycles increases, due to physical characteristics of the memory cells. Accordingly, a setting value may be changed so that as the number of erase cycles increases, a maximum value of the number of times an erase loop is performed increases.

Figure 4:
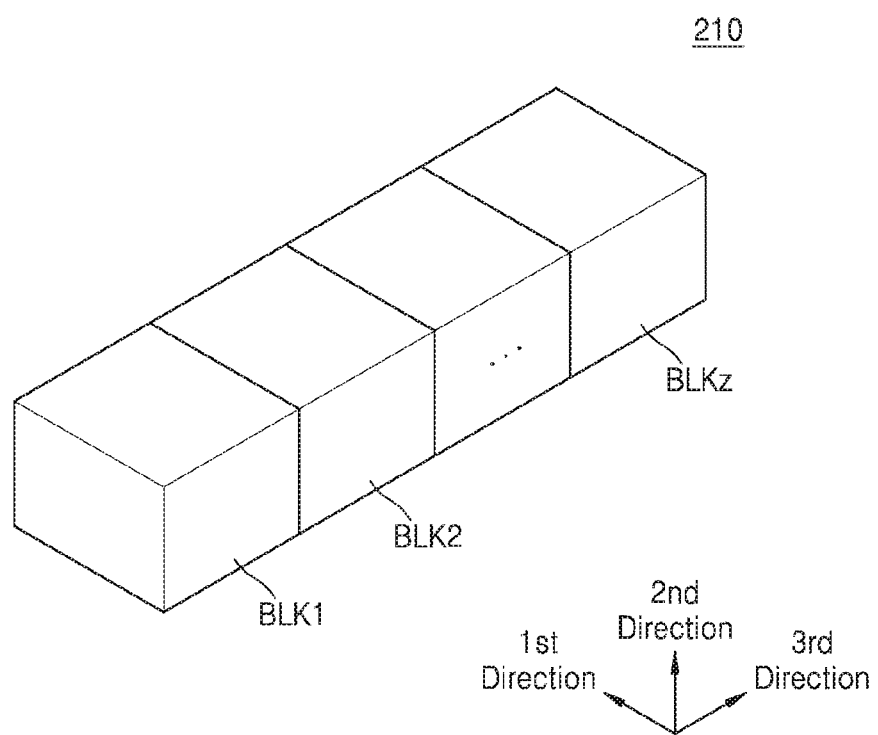
FIG. 4 is a block diagram of an example of a memory cell array included in the memory device of FIG. 1.

FIG. 4 is a block diagram of an example of the memory cell array 210 included in the memory device 200 of FIG. 1. As shown in FIG. 4, the memory cell array 210 may include VNAND memory cells.

Referring to FIG. 4, the memory cell array 210 includes a plurality of blocks BLK1 through BLKz. Each of the blocks BLK1 through BLKz may have a 3D structure (or vertical structure). Specifically, each of the blocks BLK1 through BLKz includes structures (not shown) extending in first through third directions. For example, each of the blocks BLK1 through BLKz includes a plurality of strings (not shown), i.e., a plurality of NAND strings, extending in a second direction. In this case, the plurality of strings may be spaced apart from one another by a certain distance in the first and third directions.

The blocks BLK1 through BLKz may be selected by the address decoder 240 illustrated in FIG. 3. Each of the blocks BLK1 through BLKz are connected to a plurality of bit lines BLs, string selection lines SSLs, a plurality of word lines WLs, a ground selection line GSL, and a common source line CSL. An example of each of the blocks BLK1 through BLKz will be described below with reference to FIG. 5.

Figure 5:
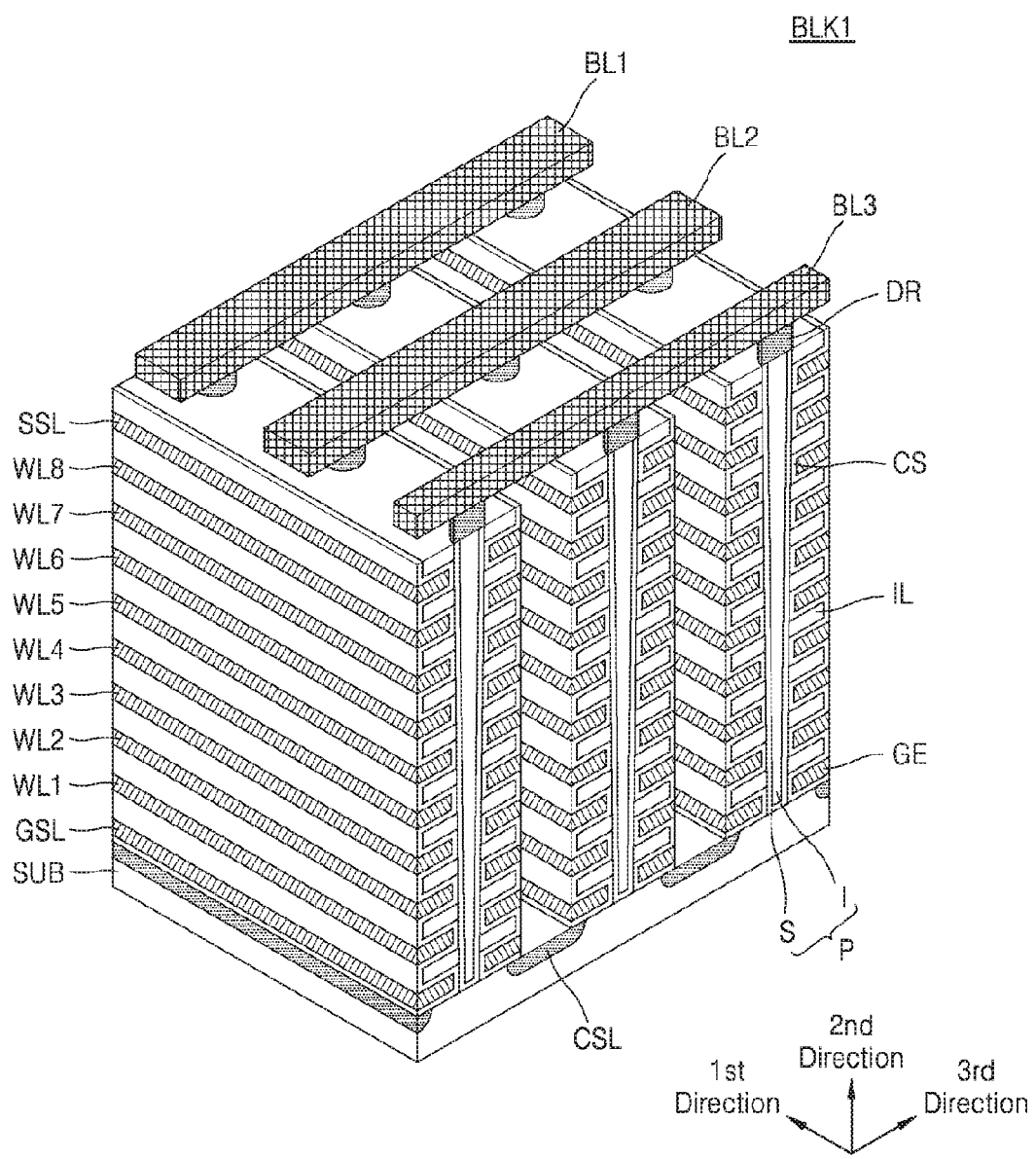
FIG. 5 is a perspective view of an example of a first block that is one of blocks illustrated in FIG. 4.

FIG. 5 is a perspective view of an example of a first block BLK1 that is one of the blocks BLK1 through BLKz of FIG. 4.

Referring to FIG. 5, the first block BLK1 is formed in a direction that is perpendicular to a substrate SUB. In FIG. 5, although the first block BLK1 includes two selection lines GSL and SSL, eight word lines WL1 through WL8, and three bit lines BL1 through BL3, the disclosure is not limited thereto.

The substrate SUB has a first conductive type (e.g., p-type), and a source line CSL that extends in a first direction and is doped with second conductive type (e.g., n-type) impurities is provided in the substrate SUB. A plurality of insulating layers IL extending in the first direction are sequentially provided in a second direction on a region of the substrate SUB between two adjacent common source lines CSL, and the plurality of insulating layers IL are spaced apart from one another by a certain distance in the second direction. For example, the plurality of insulating layers IL may include an insulating material such as silicon oxide.

A plurality of pillars P, which are sequentially arranged in the first direction and pass through the plurality of insulating layers IL in the second direction, are provided on a region of the substrate SUB between two adjacent common source lines CSL. For example, the plurality of pillars P may pass through the plurality of insulating layers IL and contact the substrate SUB. A surface layer S of each pillar P may include a silicon material having a first type and may function as a channel region. The inside of each pillar P may include an insulating material I, such as silicon oxide, or an air gap.

A charge storage layer CS is provided along exposed surfaces of the insulating layers IL, the pillars P, and the substrate SUB in a region between two adjacent common source lines CSL. For example, the charge storage layer CS may have an oxide-nitride-oxide (ONO) structure. In addition, a gate electrode GE is provided on an exposed surface of the charge storage layer CS in a region between two adjacent common source lines CSL.

Drains DR are provided on the pillars. For example, the drains DR may include a silicon material doped with the second conductive type impurities. Bit lines BL that extend in the third direction and are spaced apart from one another by a certain distance are provided on the drains DR.

Figure 6:
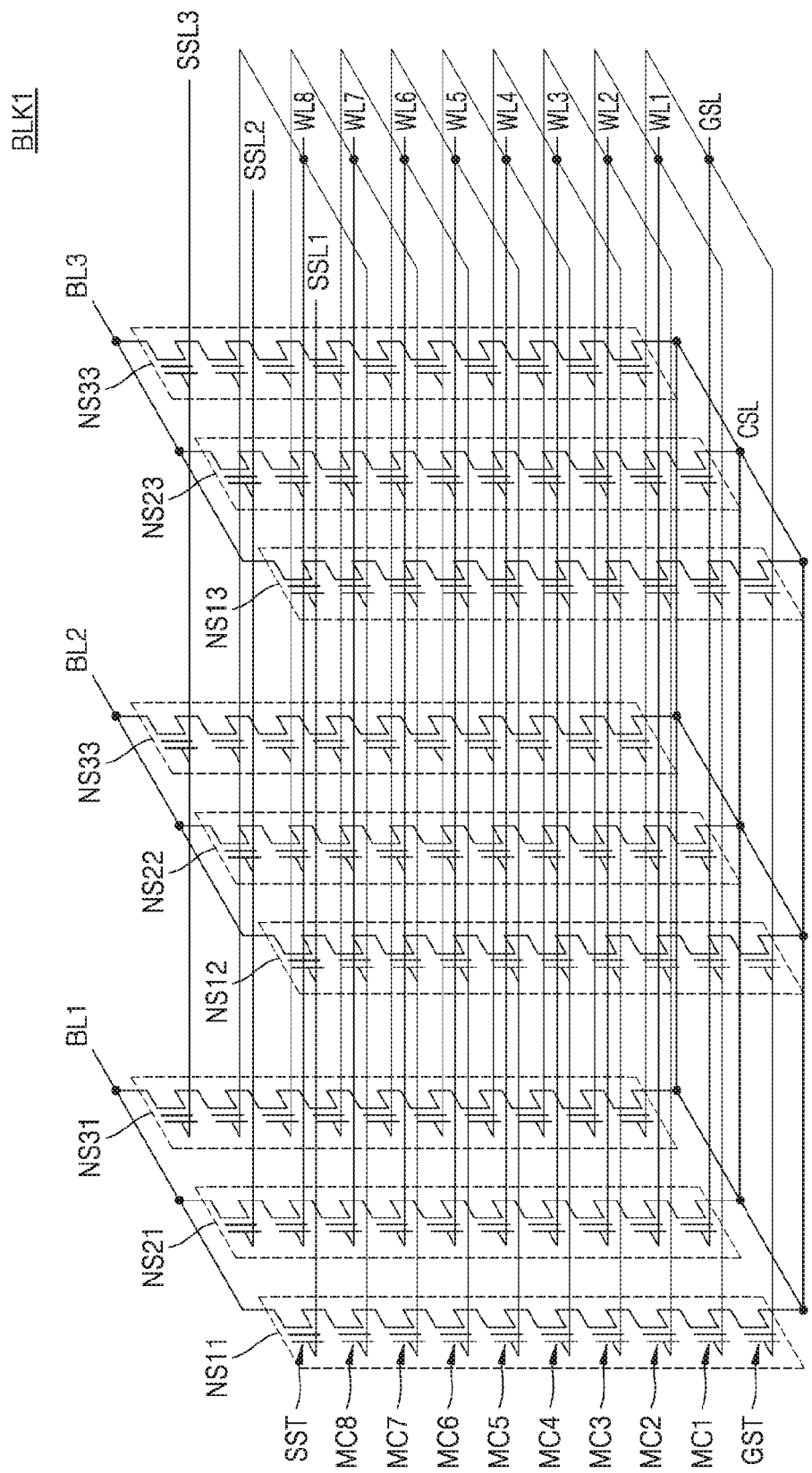
FIG. 6 is a circuit diagram of an equivalent circuit of the first block of FIG. 5.

FIG. 6 is a circuit diagram of an equivalent circuit of the first block BLK1 of FIG. 5.

Referring to FIG. 6, the first block BLK1 may be a NAND flash memory having a vertical structure, and each of the blocks BLK1 through BLKz illustrated in FIG. 4 may be implemented as shown in FIG. 6. The first block BLK1 may include a plurality of NAND strings NS11 through NS33, a plurality of word lines WL1 through WL8, a plurality of bit lines BL1 through BL3, a ground selection line GSL, a plurality of string selection lines SSL1 through SSL3, and a common source line CSL. The number of NAND strings, the number of word lines, the number of bit lines, the number of ground selection lines, and the number of string selection lines may be variously changed according to exemplary embodiments.

The NAND strings NS11, NS21, and NS31 are provided between a first bit line BL1 and the common source line CSL, the NAND strings NS12, NS22, and NS32 are provided between a second bit line BL2 and the common source line CSL, and the NAND strings NS13, NS23, and NS33 are provided between a third bit line BL3 and the common source line CSL. Each NAND string (for example, NAND string NS11) may include a string selection transistor SST, a plurality of memory cells MC1 through MC8, and a ground selection transistor GST, which are serially connected to each other. Hereinafter, for convenience of explanation, a NAND string is referred to as a string.

Strings connected to one bit line in common constitute one column. For example, the strings NS11, NS21, and NS31 connected to the first bit line BL1 in common may correspond to a first column, the strings NS12, NS22, and NS32 connected to the second bit line BL2 in common may correspond to a second column, and the strings NS13, NS23, and NS33 connected to the third bit line BL3 in common may correspond to a third column.

Strings connected to one string selection line constitute one row (or page). For example, the strings NS11, NS12, and NS13 connected to a first string selection line SSL1 may correspond to a first row, the strings NS21, NS22, and NS23 connected to a second string selection line SSL2 may correspond to a second row, and the strings NS31, NS32, and NS33 connected to a third string selection line SSL3 may correspond to a third row.

String selection transistors SST are connected to the string selection lines SSL1 through SSL3. The plurality of memory cells MC1 through MC8 are connected to the plurality of word lines WL1 through WL8, respectively. The ground selection transistor GST is connected to the ground selection line GSL. Each string selection transistor SST is connected to a bit line corresponding thereto, and the ground selection transistor GST is connected to the common source line CSL.

Word lines corresponding to the same height are connected to each other in common, and the string selection lines SSL1 through SSL3 are separated from each other. For example, to program memory cells that are connected to the first word line WL1 and that belong to the strings NS11, NS12 and NS13, the first word line WL1 and the first string selection transistor SSL1 are selected.

Figure 7:
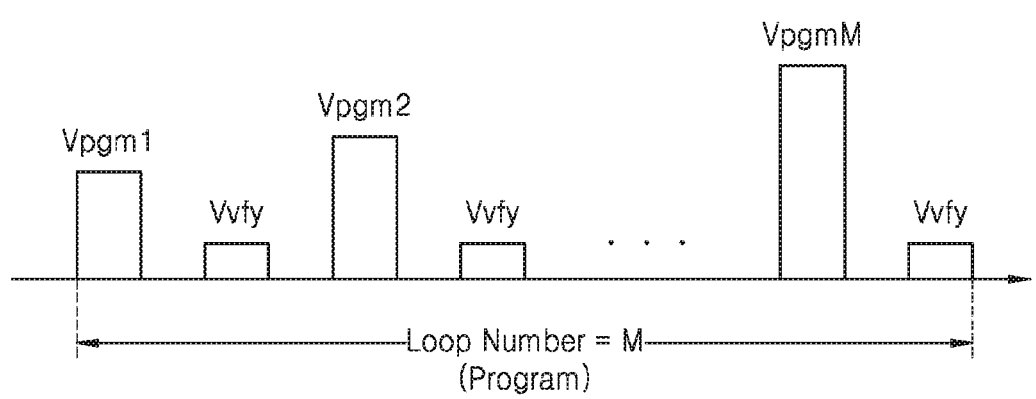
FIG. 7 is a diagram of an example of a program loop according to an incremental step pulse program (ISPP)
Figure 8:
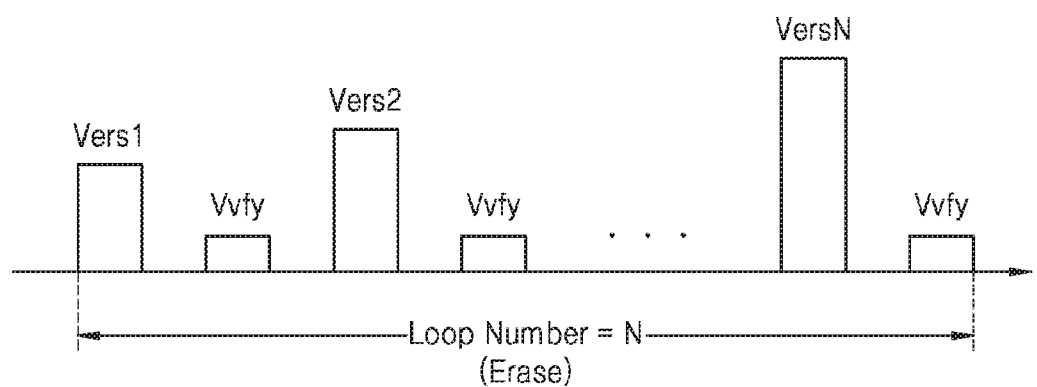
FIG. 8 is a diagram of an example of an erase loop according to an incremental step pulse erase (ISPE)

FIG. 7 is a diagram of an example of a program loop according to an incremental step pulse program (ISPP), and FIG. 8 is a diagram of an example of an erase loop according to an incremental step pulse erase (ISPE).

As illustrated in FIG. 7, a program operation may be performed by the ISPP. A program voltage Vpgm may increase by a predetermined level whenever the number of times a program loop is performed increases, and a program operation using the program voltage Vpgm and a verification operation using a verification voltage Vvfy may be performed in one program loop. For example, when a maximum value of the number of times a program loop is performed is set to M, the program voltage Vpgm may increase from a first program voltage Vpgm1 to an M-th program voltage VpgmM when M program loops are performed.

As illustrated in FIG. 8, an erase operation may be performed by the ISPE. An erase voltage Vers may increase by a predetermined level whenever the number of times an erase loop is performed increases, and an erase operation using the erase voltage Vers and a verification operation using a verification voltage Vvfy may be performed in one erase loop. For example, when a maximum value of the number of times an erase loop is performed is set to N, the erase voltage Vers may increase from a first erase voltage Vers 1 to an N-th erase voltage VersN when N erase loops are performed.

As in the exemplary embodiment described above, as the number of program/erase cycles of a memory device increases, the maximum value M of the number of times a program loop is performed and the maximum value N of the number of times an erase loop is performed may be changed. When the maximum value M of the number of times a program loop is performed increases, data may be written through a greater number of program loops in response to a write request. In addition, in determining a program fail, the number of times a program loop is performed, which is a criterion of pass/fail determination, increases.

Figure 9:
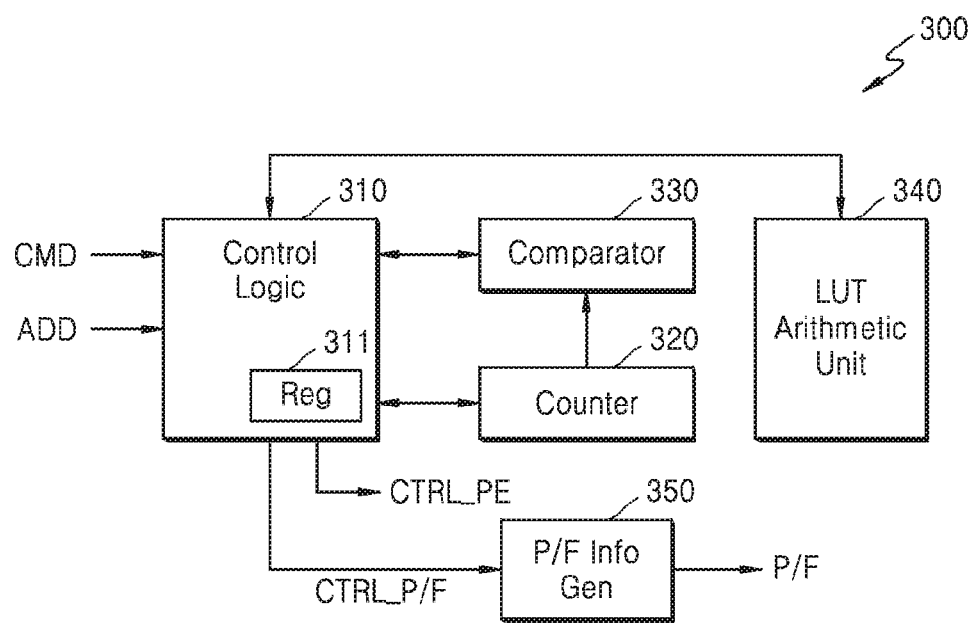
FIG. 9 is a block diagram of a memory device for changing the number of times a program/erase loop is performed, according an exemplary embodiment of the disclosure.

FIG. 9 is a block diagram of a memory device 300 for changing the number of times a program/erase loop is performed, according an exemplary embodiment of the disclosure.

As illustrated in FIG. 9, the memory device 300 may include a control logic 310, a counter 320, a comparator 330, a look-up table 340, and a pass/fail information generator 350. The memory device 300 may further include other function blocks related to memory operations, for example, a memory cell array, an address decoder, a voltage generator, and the like. For convenience of explanation, detailed descriptions of the other function blocks are omitted.

The control logic 310 may control the overall operation of the memory device 300. For example, the control logic 310 may include a register 311 that stores information related to maximum and minimum values of the number of times a program loop is performed and information related to maximum and minimum values of the number of times an erase loop is performed in an erase operation. The control logic 310 may generate various control signals related to memory operations, based on analyzing a command CMD and an address ADD.

Whenever a write command and an erase command are received, the control logic 310 provides information about the received commands to the counter 320, and the counter 320 performs a counting operation in response to the received information. A program/erase cycle may be detected according to a counting result of the counter 320.

The comparator 330 compares the value of a detected program/erase cycle to a predetermined reference value and generates a comparison result. The control logic 310 may determine, based on the comparison result, a timing for changing a setting value indicating a maximum or minimum number of program/erase loops. As a result of the determination, when the number of program/erase cycles increases and the current timing corresponds to a timing when a setting value, of the number of times a program/erase loop is performed, is to be changed, the control logic 310 may refer to information stored in the look-up table 340 and determine information related to the number of loops corresponding to the current program/erase cycle. Information related to the maximum and minimum number of program/ erase loops that are set based on the changed setting-value may be stored in the register 311.

When the command CMD provided to the memory device 300 corresponds to a writ/erase request, the control logic 310 generates and outputs various control signals CTRL_PE related to a program operation and an erase operation. In addition, in the program operation and the erase operation, the control logic 310 controls the memory device 300 so that a program/erase loop is performed based on a setting value stored in the register 311.

If a memory cell into which data is not normally written exists (or, if a non-correctable error occurs) as a result of performing loops based on the number of loops set according to a changed setting-value, a control signal CTRL_P/F directing that pass/fail information P/F, which indicates that a memory cell into which data is not normally written exists, is to be generated may be provided to the pass/fail information generator 350. The pass/fail information generator 350 may provide pass/fail information P/F of a program operation in response to the control signal CTRL_P/F. The erase operation may also be similarly performed. In other words, if a memory cell that is not normally erased exists as a result of performing loops based on the number of loops set according to a changed setting-value, the pass/fail information generator 350 may provide pass/fail information P/F indicating that a memory cell which is not normally erased exists.

Although the look-up table 340 is illustrated in FIG. 9 as a means for providing maximum value/minimum value information about the number of loops, the disclosure is not limited thereto. For example, an arithmetic unit may be used instead of the look-up table 340, information related to a program/erase cycle may be provided to the arithmetic unit under the control of the control logic 310, and a maximum value and/or a minimum value of the number of loops may be calculated based on an arithmetic operation of the arithmetic unit.

Figure 10:
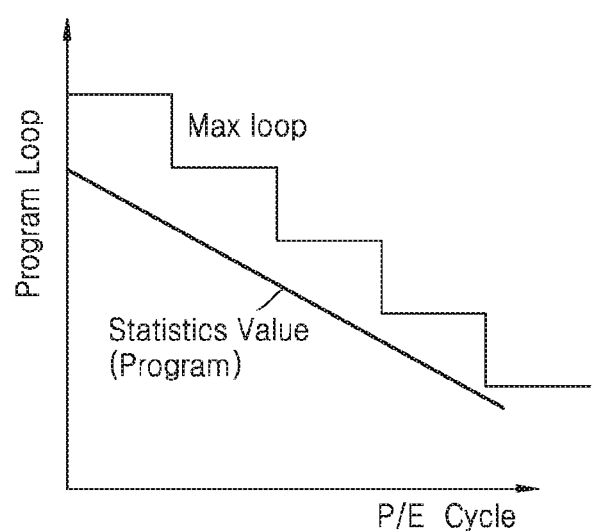
FIGS. 10 and 11 are graphs illustrating examples in which a maximum value of the number of loops is changed according to a program/erase cycle.
Figure 11:
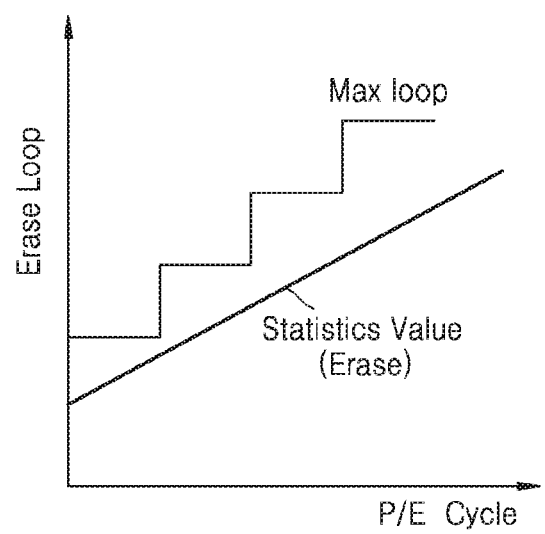

FIGS. 10 and 11 are graphs illustrating examples in which a maximum value of the number of loops is changed according to a program/erase cycle.

As illustrated in FIG. 10, as the number of program/erase cycles increases, a program loop may only need to be performed a relatively small number of times to complete a data program operation, due to characteristics of memory cells. Based on the characteristics of memory cells, a setting value may be changed so that a maximum value of the number of times a program loop is performed decreases in response to the increase of the number of program/erase cycles. The setting value may be changed by any of various methods, and for example, the maximum value of the number of times a program loop is performed may be changed step by step according to the increase of the number of program/erase cycles, as shown in FIG. 10. As an example, the maximum value of the number of times a program loop is performed may be set to 12 times when the number of program/erase cycles is within 1 k, may be changed to 11 times when the number of program/erase cycles is between 1 k and 2 k, and may be changed to 11 times when the number of program/erase cycles is between 2 k and 3 k.

As illustrated in FIG. 11, as the number of program/erase cycles increases, a program loop may need to be performed a relatively large number of times to complete an erase operation, due to characteristics of memory cells. Based on the characteristics of memory cells, a setting value may be changed so that a maximum value of the number of times an erase loop is performed increases in response to the increase of the number of program/erase cycles. As an example, the maximum value of the number of times an erase loop is performed may be set to 3 times when the number of program/erase cycles is within 1 k, may be changed to 4 times when the number of program/erase cycles is between 1 k and 2 k, and may be changed to 5 times when the number of program/erase cycles is between 2 k and 3 k.

Figure 12:
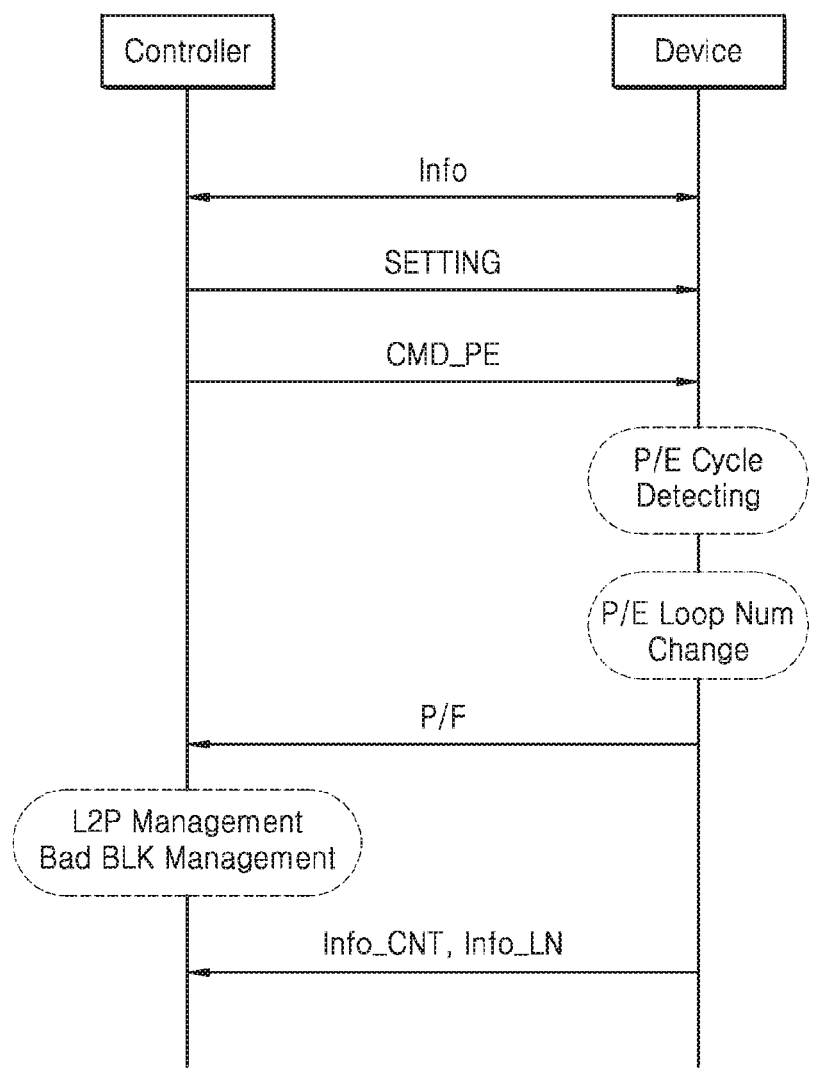
FIG. 12 is a diagram illustrating an outline of the overall operation of a memory system, according to an exemplary embodiment of the disclosure.

FIG. 12 is a diagram illustrating an outline of the overall operation of a memory system, according to an exemplary embodiment of the disclosure.

As shown in FIG. 12, various pieces of information Info may be transmitted and received between a memory controller and a memory device while the memory system is initially operated, and the memory controller may provide various pieces of setting information SETTING, for setting an operating environment of the memory device, to the memory device. As an example, the memory device may provide information, obtained by counting the number of program/erase cycles, to the memory controller and may also provide table information (for example, information related to the number of loops according to the number of program/erase cycles) stored therein, in a non-volatile manner, to the memory controller.

According to an exemplary embodiment, the setting information SETTING that is provided by the memory controller may include information for setting a maximum value and a minimum value of the number of times a program loop is performed. Also, the setting information SETTING may include information for setting a maximum value and a minimum value of the number of times an erase loop is performed. The memory device may perform a program operation according to the maximum and minimum values of the number of times a program loop is performed, and may perform an erase operation according to the maximum and minimum values of the number of times an erase loop is performed.

The memory controller may provide various commands for a memory operation to the memory device. For example, the memory controller may provide a command CMD_PE requesting a write and erase operation to the memory controller. The memory controller and the memory device each may perform an internal operation related to the memory operation. In the same manner as or similarly to the above-describe embodiment, the memory device may detect the number of program/erase cycles by performing a counting operation in response to the reception of the command CMD_PE. Also, the memory device may change a setting value related to the number of times a program/erase loop is performed, according to a result obtained by detecting the number of program/erase cycles.

Then, the memory device may perform a program loop and an erase loop according to a changed setting-value, and may generate information P/F indicating whether a program operation has passed or failed or whether an erase operation has passed or failed, based on the changed setting-value. The memory controller may receive the information P/F and process a cell region (for example, page or block) corresponding to a fail as a bad region in response to the information P/F. If a program fail occurs in a page that is requested for data writing, the memory controller may manage the memory device so that data is written to another page by changing address mapping information. Alternatively, the memory controller may process a block, which includes a page in which a program fail occurs, as a bad block or process a block, in which an erase fail occurs, as a bad block.

As described above, the memory device may internally perform a counting operation and an operation for changing a setting value and provide a result of such to the memory controller. For example, the memory device may provide counting information Info_CNT to the memory controller whenever the number of program/erase cycles reaches a certain value. When a change in the number of times a program/erase loop is performed occurs according to a result obtained by detecting the number of program/erase cycles, the memory device may provide loop number information Info_LN indicating the change to the memory controller.

Figure 13:
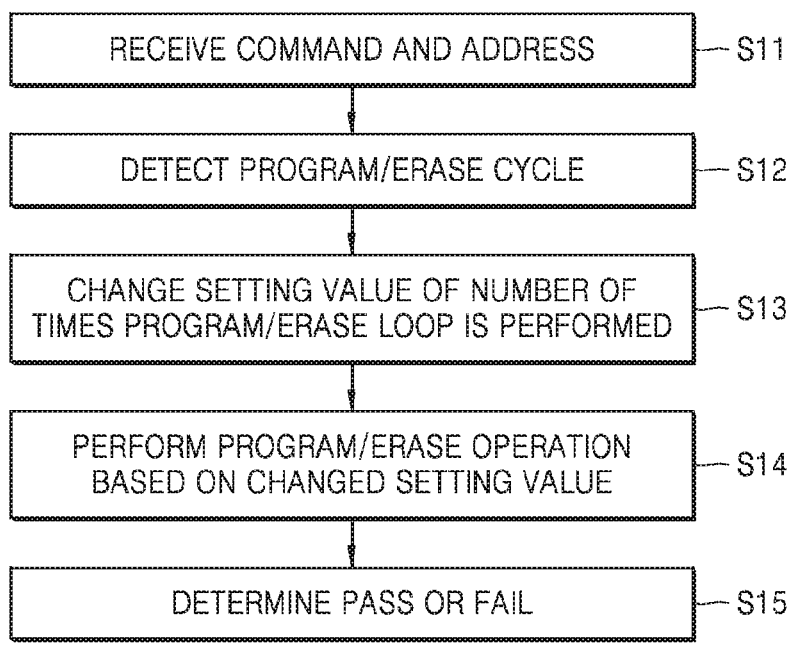
FIG. 13 is a flowchart illustrating a method of operating a memory device, according to an exemplary embodiment of the disclosure.

FIG. 13 is a flowchart illustrating a method of operating a memory device, according to an exemplary embodiment of the disclosure.

As shown in FIG. 13, the memory device may receive various commands and addresses, related to a memory operation, from a memory controller (Operation S11). The memory device may determine a program/erase request by analyzing a received command, and may detect the number of program/erase cycles by performing a counting operation according to a result of the determination (Operation S12). A result of the detection may be compared with a reference value.

The number of times a program/erase loop is performed may be changed according to a result of the comparison. For example, the number of times a program/erase loop is performed may be changed whenever the number of program/erase cycles reaches a predetermined number of times. In other words, it may be determined whether the number of program/erase cycles reaches a predetermined value, depending on the result of the comparison, and a setting value of the number of times a program/erase loop is performed may be changed whenever the number of program/erase cycles reaches a predetermined value (Operation S13).

Then, various commands may be received from the memory controller, and when a write command or an erase command is provided from the memory controller, a program/erase operation is performed based on the changed setting-value (Operation S14). As an example, the setting value may include information related to a maximum value of the number of times a program loop is performed and a maximum value of the number of times an erase loop is performed, and the program/erase loops are performed according to the maximum value of the number of times a program loop is performed and the maximum value of the number of times an erase loop is performed. When a program/erase operation is completed in a loop within the set maximum value, the memory device may determine that the program/erase operation has passed. On the other hand, when the program/erase operation is not completed even after a loop corresponding to the set maximum value is performed, the memory device may determine the program/erase operation to be failed (Operation S15).

Figure 14:
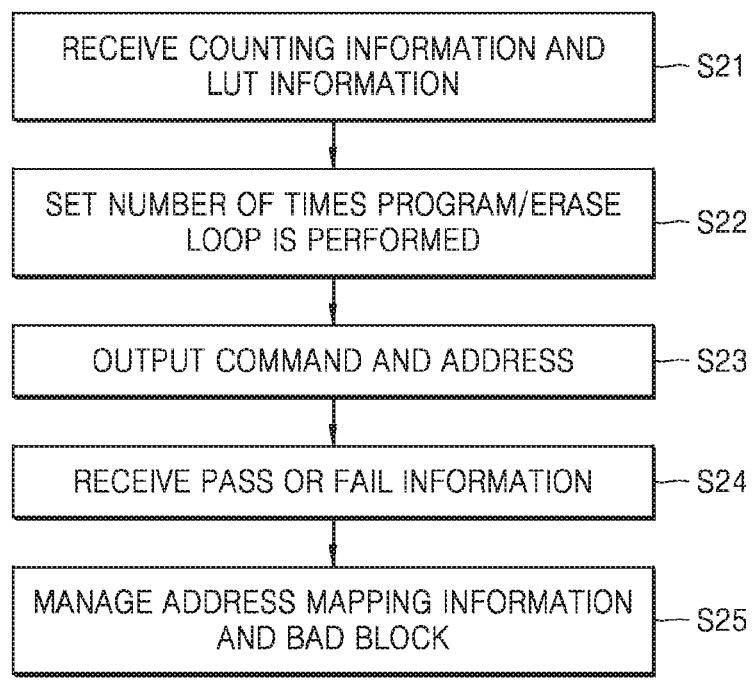
FIG. 14 is a flowchart illustrating a method of operating a memory controller, according to an exemplary embodiment of the disclosure.

FIG. 14 is a flowchart illustrating a method of operating a memory controller, according to an exemplary embodiment of the disclosure.

In an initial operation of a memory system, various pieces of information may be transmitted and received between a memory controller and a memory device. As an example, the memory controller may receive counting information indicating the number of program/erase cycles of the memory device, and may also receive table information related to the number of times a program/erase loop is performed, according to the number of program/erase cycles (Operation S21).

The memory controller may perform various setting operations related to an operating environment of the memory device based on the received information, and for example, the memory controller may set the number of times a program/erase loop is performed in the memory device, with reference to the counting information and the table information (Operation S22). As an example, the memory controller may set information related to a maximum value of the number of times a program loop is to be performed in response to a write command, and may also set information related to a maximum value of the number of times an erase loop is to be performed in response to an erase command.

When the initial setting operation as described above is completed, various pieces of information for a memory operation may be transmitted and received between the memory controller and the memory device, and for example, the memory controller may output a command and an address to the memory device (Operation S23). The memory device may perform a memory operation by performing a program/erase loop according to the embodiment described above. The memory device may perform the program/erase loop based on a setting value, and may also determine whether a program/erase operation has passed or failed. The memory controller may receive information indicating whether the program/erase operation has passed or failed, from the memory device (Operation S24). The memory controller may perform a management for address mapping information and a bad block management based on the received information (Operation S25).

Figure 15A:
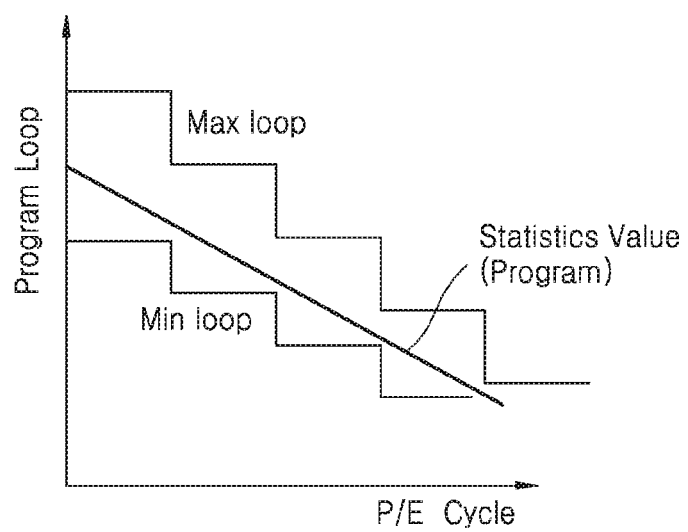
FIGS. 15A and 15B are graphs illustrating examples of changing a maximum value and a minimum value of the number of loops, according to an exemplary embodiment of the disclosure.
Figure 15B:
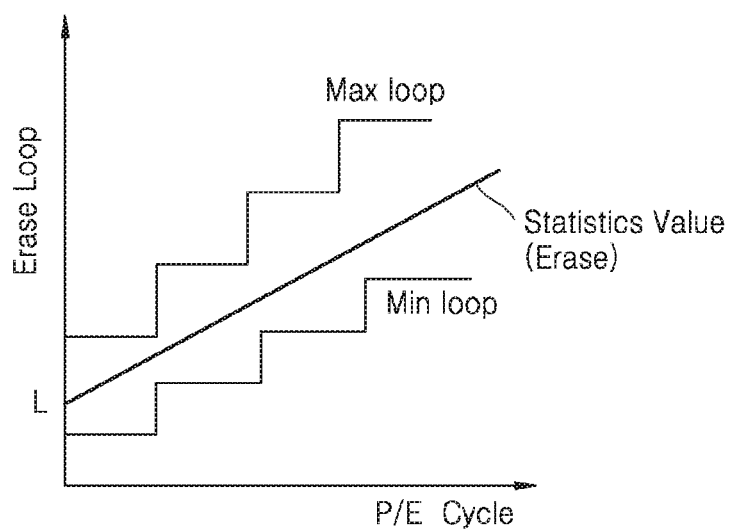

FIGS. 15A and 15B are graphs illustrating examples of changing a maximum value and a minimum value of the number of loops, according to an exemplary embodiment of the disclosure.

As shown in FIG. 15A, as the number of program/erase cycles increases, the average number of times program loops of memory cells are performed decreases, and thus, a setting value may be changed so that a maximum value of the number of times a program loop is performed gradually decreases. Similarly, a setting value for a minimum value of the number of times a program loop is performed may also be changed, for example, may be changed so that as the number of program/erase cycles increases, a minimum value of the number of times a program loop is performed gradually decreases.

In performing a program operation based on a changed setting-value, it may be determined that a write operation has passed when data is normally written to memory cells with the number of loops which is equal to or greater than the minimum value or is equal to or less than the maximum value. On the other hand, when data is normally written to memory cells with the number of loops which is less than the minimum value, it may be determined that the dispersion of a threshold voltage of the memory cells has been abnormally shifted, and thus, it may be appropriate that a cell region including the memory cells is managed as a bad region. In addition, when at least some pieces of data are not normally written to memory cells even after a program loop is performed a number of times corresponding to the maximum value, a cell region including the memory cells may be managed as a bad region.

As shown in FIG. 15B, as the number of program/erase cycles increases, a setting value of the number of times an erase loop is performed may be changed. For example, a setting value may be changed so that as the number of program/erase cycles increases, a maximum value of the number of times an erase loop is performed gradually increases and a minimum value of the number of times an erase loop is performed gradually increases.

An operation of determining whether an erase operation has passed or failed may be performed in a manner that is similar to or the same as the program operation described above. For example, when data is normally erased by performing an erase loop a number of times that is equal to or greater than the minimum value or is equal to or less than the maximum value, it may be determined that an erase operation has passed. On the other hand, when data of memory cells is completely erased by performing an erase loop a number of times that is less than the minimum value or when at least some pieces of data of the memory cells are not normally erased even by performing an erase loop a number of times that corresponds to the maximum value, a cell region including the memory cells may be managed as a bad region.

Figure 16:
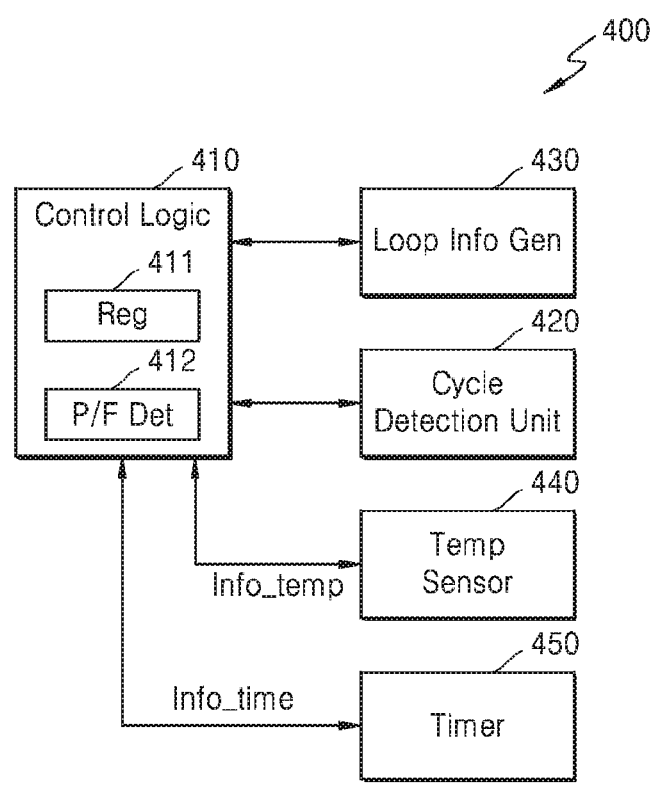
FIG. 16 is a block diagram of an example of a memory device according to another exemplary embodiment of the disclosure.

FIG. 16 is a block diagram of an example of a memory device 400 according to another exemplary embodiment of the disclosure. FIG. 16 illustrates an example in which a setting value of the number of loops is changed by using at least one other element in addition to the number of program/erase cycles.

As illustrated in FIG. 16, the memory device 400 may include a control logic 410, a cycle detection unit 420, a loop information generator 430, a temperature sensor 440, and a timer 450. In addition, the memory device 400 may further include function blocks related to a memory operation, for example, a memory cell array, an address decoder, a voltage generator, etc, and the function blocks are not illustrated in FIG. 16 for convenience of explanation. Among various function blocks illustrated in FIG. 16, function blocks that are the same as those in the exemplary embodiments described above will not be described in detail.

The control logic 410 may control the overall operation of the memory device 400, and may also determine whether a program/erase operation has passed or failed. The control logic 410 may include a register 411 and a pass/fail determination unit 412. The control logic 410 may receive a program result during a program operation and determine whether the program operation has passed or failed, and may receive an erase result during an erase operation and determine whether the erase operation has passed or failed.

The cycle detection unit 420 may detect the number of program/erase cycles, similar to that of the exemplary embodiment described above. For example, the cycle detection unit 420 may detect the number of cycles by performing a counting operation in response to a write command and an erase command. The loop information generator 430 may include a look-up table including maximum value/minimum value information of the number of loops corresponding to the number of cycles. As another exemplary embodiment, the loop information generator 430 may generate maximum value/minimum value information of the number of loops by performing an arithmetic operation using detected cycle information.

The temperature sensor 440 may detect the internal temperature of the memory device 400 and generate temperature information Info_temp. The timer 450 may generate time information Info_time related to various memory operations that are performed in the memory device 400. The control logic 410 may perform a control operation so that a setting value of the number of times a program/erase loop is performed is changed according to the exemplary embodiment described above. For example, the control logic 410 may perform a control operation by using the temperature information Info_temp and the time information Info_time.

As an exemplary embodiment, when setting a maximum value and a minimum value of the number of times a program/erase loop is performed, the maximum value and the minimum value may be adjusted according to the internal temperature of the memory device. The look-up table in the loop information generator 430 may include table information related to a program/erase cycle value, a temperature value, and the number of times a program/erase loop is performed. The control logic 410 may refer to information of the look-up table, and thus may reflect the internal temperature of the memory device and change a setting value of the number of loops.

Although a loop is performed by using the same program voltage (or erase voltage) during a program operation (or erase operation), the amount of variation of a threshold voltage of memory cells may vary according to the internal temperature of the memory device 400. A process of reflecting temperature information and changing a setting value related to the number of loops may be variously performed. For example, when a maximum value of the number of times a program loop is performed decreases depending on the increase of the number of program/erase cycles, the maximum value of the number of times a program loop is performed may be adjusted so that the maximum value decreases more or decreases less depending on temperature information Info-temp.

When determining a timing for changing a setting value of the number of loops, the timer 450 may be used, besides a method of detecting the number of cycles as in the exemplary embodiment described above. For example, when the number of program/erase cycles is low, a data program may be completed by performing a relatively great number of program loops. The timer 450 may detect a time that is required for a program operation and provide the time information Info_time indicating the time.

The control logic 410 may change a setting value related to the number of times a program loop is performed, with reference to the time information Info_time. For example, as the number of program/erase cycles increases, data may be written through a relatively small number of program loops, and thus, a program operation may be completed within a relatively short time. The control logic 410 may detect the time information Info_time and analyze a time required for the program operation, and may determine a timing for changing a setting value of the number of times a program/ erase loop is performed. Also, the control logic 410 may change the setting value so that a maximum value of the number of times a program loop is performed decreases according to a result of the determination.

Besides a method of changing the number of times a program/erase loop is performed, according to the increase of the number of program/erase cycles, the current exemplary embodiment of the disclosure may be variously modified. For example, the control logic 410 may change a maximum value and a minimum value of a program operating time, and may also change a maximum value and a minimum value of an erase operating time. As another exemplary embodiment, the control logic 410 may perform a pass/fail determination for a program or erase operation by using the time information Info_time from the timer 450.

As the number of program/erase cycles increases, a setting value may be changed so that a maximum value and a minimum value of a time during which a program operation is performed decrease. For example, when a program loop is performed at regular intervals, the decrease of a time during which a program operation is performed may correspond to the decrease of the number of loops. Accordingly, when program loops are performed within a set time and a data program is not completed within the set time, it may be determined that a program fail occurs.

Figure 17:
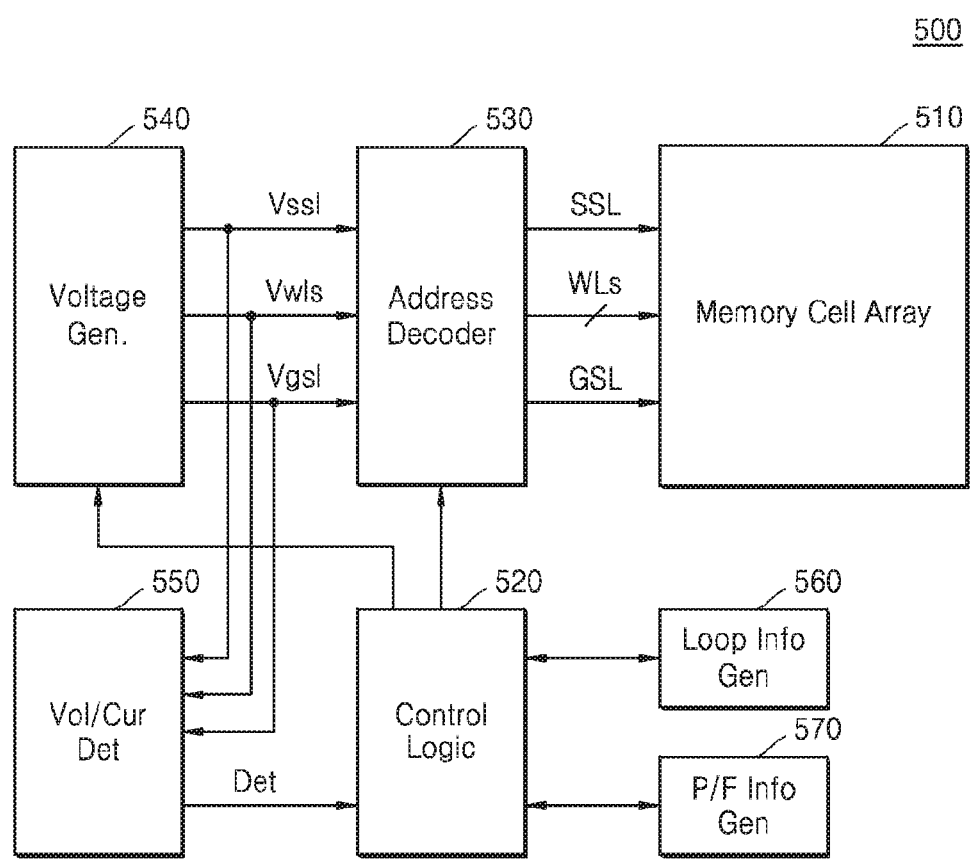
FIG. 17 is a block diagram of an example of a memory device according to another exemplary embodiment of the disclosure.

FIG. 17 is a block diagram of an example of a memory device 500 according to another exemplary embodiment of the disclosure. FIG. 17 illustrates an example in which a progressive defect that may occur in the memory device 500 is detected in advance and a setting value of the number of times a program/erase loop is performed is changed based on a result of the detection.

As illustrated in FIG. 17, the memory device 500 may include a memory cell array 510, a control logic 520, an address decoder 530, a voltage generator 540, a voltage/ current detector 550, a loop information generator 560, and a pass/fail information generator 570. In addition, the memory device 500 may further include function blocks related to a memory operation, for example, a page buffer, an input/output circuit, etc. Among various function blocks illustrated in FIG. 17, function blocks that are the same as those in the exemplary embodiments described above will not be described in detail.

In the case of a flash memory device such as a VNAND, a bridge may occur between various signal transmission paths (for example, a word line, a string selection line, a ground selection line, a common source line, etc.) in a progressive manner, and a performance degradation of a memory operation may occur when a current is leaked due to the bridge.

According to the current exemplary embodiment of the disclosure, voltage or current levels of signals that are transmitted via various paths may be detected and the extent of a progressive defect may be determined based on a result of the detection. As an example, the voltage generator 540 may generate various voltage signals related to a memory operation. For example, the voltage generator 540 may generate a string selection voltage Vss1 that is provided to a string selection line SSL, word line voltages Vw1s that are provided to word lines WLs, and a ground selection voltage Vgs1 that is provided to a ground selection line GSL. The various voltage signals generated by the voltage generator 540 may be provided to various lines, that is, the string selection line SSL, the word lines WLs, and the ground selection line GSL, via the address decoder 530.

The voltage/current detector 550 may be connected to at least one output of the voltage generator 540 and detect a voltage level and/or a current level. The voltage/current detector 550 may also generate a detection result Det, and the control logic 520 may change a setting value related to the number of times a program/erase loop is performed, by using the detection result Det.

When a read operation for the memory cell array 510 is performed, a set-up operation for the various lines SSL, WLs, and GSL is performed, and thus, the voltages Vss1, Vw1s, and Vgs1 having predetermined set-up levels may be provided. If a bridge occurs between lines transmitting the voltages Vss1, Vw1s, and Vgs1 or between the various lines SSL, WLs, and GSL connected to the memory cell array 510, the voltage/current detector 550 may monitor the extent of leakage by detecting a voltage or current level of the voltages Vss1, Vw1s, and Vgs1.

As another embodiment, in a program operation and a reading operation, a relatively high voltage may be applied to some (for example, a non-selected word line) of the various lines SSL, WLs, and GSL, and a relatively low voltage may be applied to some other lines (for example, a selected word line). For example, when a bridge occurs in a non-selected word line, a voltage level of the non-selected word line may decrease. On the other hand, when a bridge occurs in a selected word line, a voltage level of the non-selected word line may increase.

The extent of a progressive defect may be analyzed with reference to the detection result Det from the voltage/current detector 550, and a setting value related to the number of times a program/erase loop is performed may be changed based on a result of the analysis. For example, when a progressive defect does not occur or the extent thereof is small, a maximum value and a minimum value of the number of loops may be set to correspond to a relatively small number of program/erase cycles according to the exemplary embodiment described above. On the other hand, when the extent of the progressive defect is large, the maximum value and the minimum value of the number of loops may be set to correspond to a relatively great number of program/erase cycles according to the exemplary embodiment described above. The control logic 520 may change a setting value related to the number of times a program/erase loop is performed, with reference to the detection result Det and the information of the loop information generator 560. Also, the control logic 520 may determine whether a program operation (or an erase operation) has passed or failed, according to a result obtained by performing a program loop (or an erase loop), and the pass/fail information generator 570 may generate a pass or fail signal.

Figure 18A:
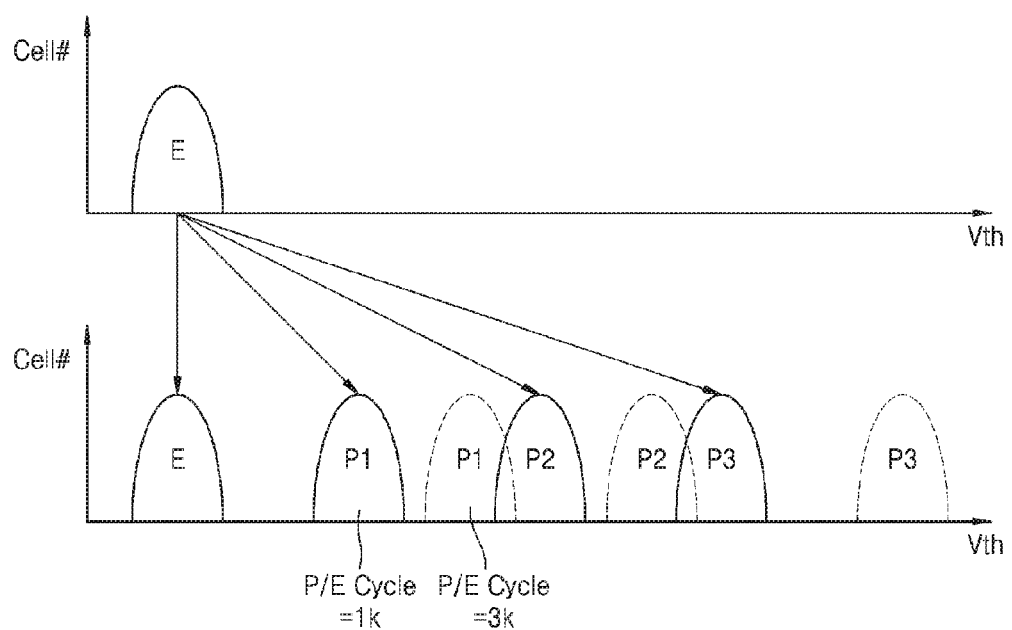
FIG. 18A is a graph illustrating an example of an operation of a memory device according to another exemplary embodiment of the disclosure.
Figure 18B:
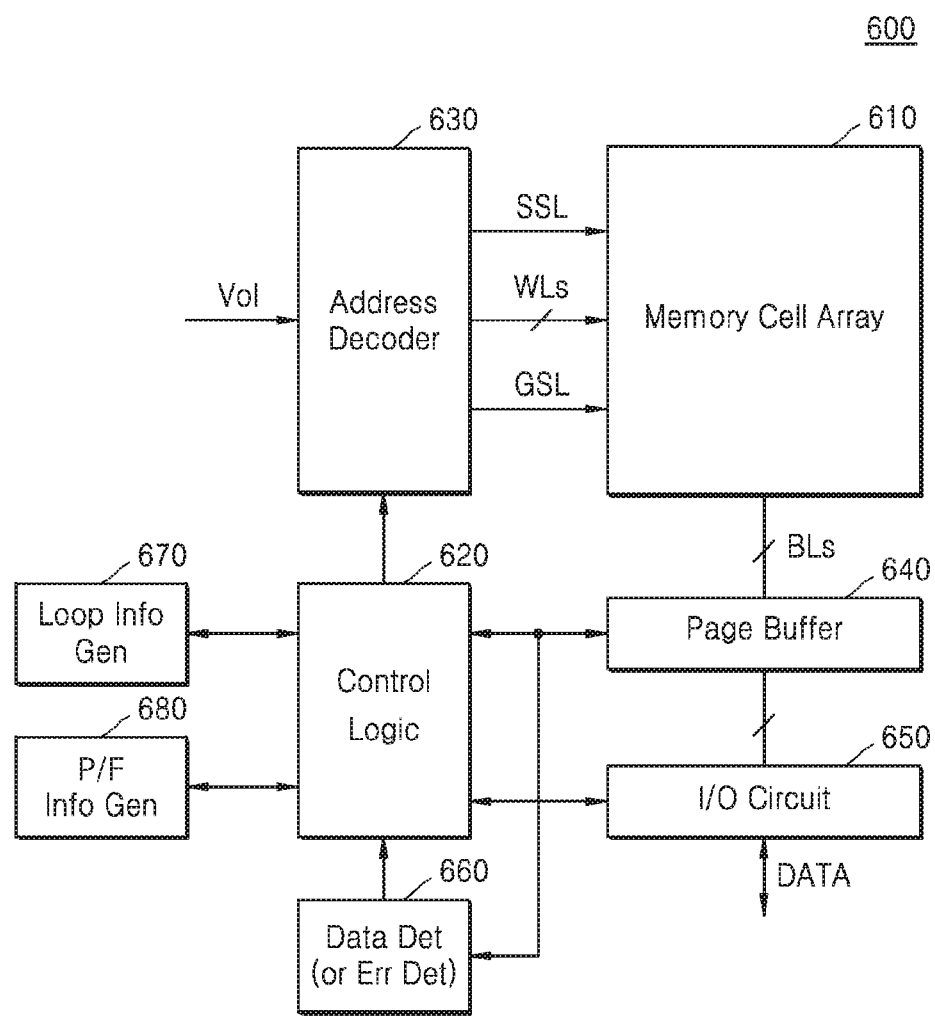
FIG. 18B is a block diagram of a memory device according to another exemplary embodiment of the disclosure.

FIG. 18A is a graph illustrating an example of an operation of a memory device according to another exemplary embodiment of the disclosure, and FIG. 18B is a block diagram of a memory device according to another exemplary embodiment of the disclosure. FIG. 18A illustrates an example, in which a setting value of the number of times a program/erase loop is performed is changed based on a result obtained by performing a one shot program, as an example of a program operation.

The one shot program is an operation of simultaneously programming data having a number of bits into memory cells storing multi-bit data. Accordingly, as illustrated in FIG. 18A, an erase state E of the memory cells may be changed to a plurality of states (for example, first to third program states P1 to P3) by the one shot program.

As described above, as the number of program/erase cycles increases, a threshold voltage of a memory cell may greatly increase when a program loop using the same program voltage is performed. For example, when a one shot program is performed by using a certain program voltage, threshold voltage dispersion as illustrated with a solid line may be obtained if the number of program/erase cycles is small (for example, 1 k) as illustrated in FIG. 18A. On the other hand, threshold voltage dispersion as illustrated with a dashed line may be obtained if the number of program/erase cycles is larger (for example, 3 k).

After the one shot program is performed, threshold voltage dispersion may be analyzed through a data determination operation. For example, a read operation may be performed by using a read voltage for determining a state of each memory cell, and threshold voltage dispersion may be analyzed by analyzing read data. Characteristics (for example, characteristics of memory cells or the number of program/erase cycles) of the memory device 600 may be determined with reference to the analysis result.

Referring to FIG. 18B, the memory device 600 may include a memory cell array 610, a control logic 620, an address decoder 630, a page buffer 640, an input/output circuit 650, a data determination unit 660, a loop information generator 670, and a pass/fail information generator 680. The memory device 600 may further include other function blocks related to a memory operation.

The control logic 620 may control the overall operation of the memory device 600. For example, the control logic 620 may control various internal elements of the memory device 600 so that a one shot program as described above is performed. After the one shot program is performed, data of programmed memory cells may be read and read data may be provided to the data determination unit 660 via the page buffer 640. The data determination unit 660 may provide a result, obtained by determining the read data, to the control logic 620.

The control logic 620 may change a setting value related to the number of program/erase loops based on a data determination result. Similar to the embodiment described above, the setting value may be changed by using a data determination result and information of the loop information generator 670. Also, the control logic 620 may determine whether a write operation or an erase operation has passed or failed, based on a changed setting-value. The pass/fail information generator 680 may generate pass/fail information under the control of the control logic 620.

Figure 19A:
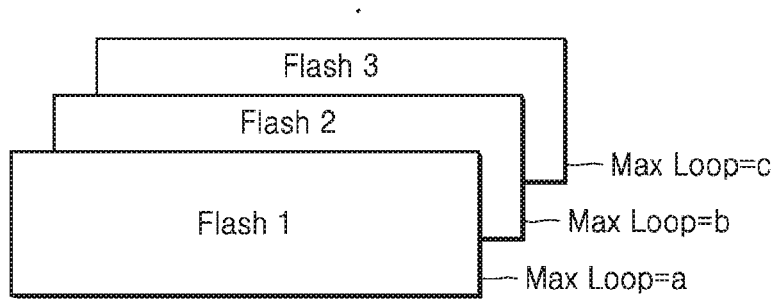
FIGS. 19A to 19C are diagrams illustrating examples of setting a maximum value and a minimum value of the number of times a program/erase loop is performed.
Figure 19B:
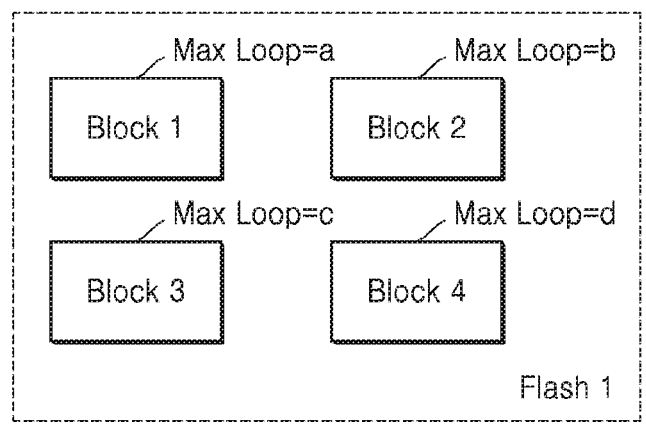
Figure 19C:
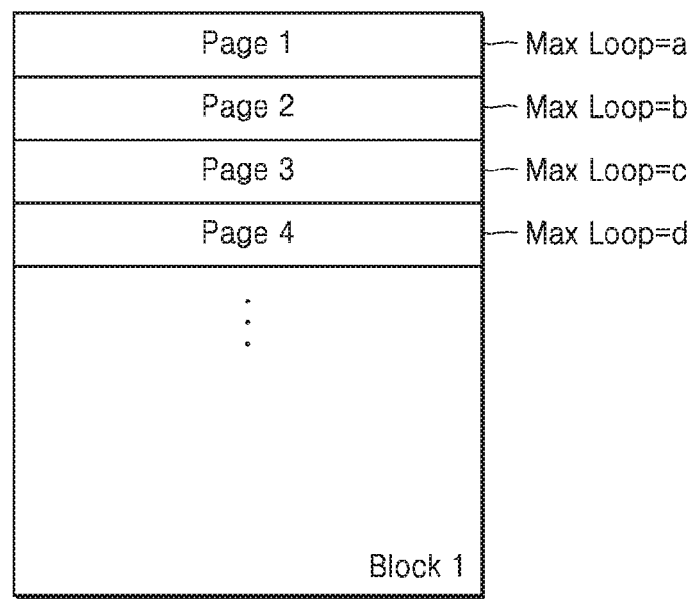

FIGS. 19A to 19C are diagrams illustrating examples of setting a maximum value and a minimum value of the number of times a program/erase loop is performed.

As illustrated in FIG. 19A, a memory device may include a plurality of memory chips (for example, flash memory chips), and the memory chips may have different program/erase cycle values. For example, each of the memory chips may include a cycle detection unit (not shown), and the cycle detection unit of each memory chip may detect a program/erase cycle of the memory chip.

Since the memory chips may have different program/erase cycle values, a maximum value and a minimum value of the number of times a program/erase loop is performed may also be set differently for each memory chip. For example, a maximum value of the number of times a program loop is performed in a first memory chip Flash 1 may have an "a" value, a maximum value of the number of times a program loop is performed in a second memory chip Flash 2 may have a "b" value, and a maximum value of the number of times a program loop is performed of a third memory chip Flash 3 may have a "c" value.

As illustrated in FIG. 19B, each memory chip (for example, the first memory chip Flash 1) may include a plurality of blocks Block 1 to Block 4, and the plurality of blocks Block 1 to Block 4 of the memory chip may have different program/erase cycle values. As an example, a cycle detection unit (not shown) in the first memory chip Flash 1 may detect a program/erase cycle in units of blocks. In addition, as an example, in FIG. 19B, a maximum value of the number of times a program loop is performed in a first block Block 1 has an "a" value, a maximum value of the number of times a program loop is performed in a second block Block 2 has a "b" value, a maximum value of the number of times a program loop is performed in a third block Block 3 has a "c" value, and a maximum value of the number of times a program loop is performed in a fourth block Block 4 has a "d" value.

As illustrated in FIG. 19C, each block (for example, the first block Block 1) may include a plurality of pages Page 1, Page 2, . . . , and the plurality of pages Page 1, Page 2, . . . of the block may have different program/erase cycle values. As an example, a cycle detection unit (not shown) in the memory chip including the first block Block 1 may detect a program/erase cycle in units of pages. As illustrated in FIG. 19C, a maximum value of the number of times a program loop is performed may be set differently for each page.

Figure 20:
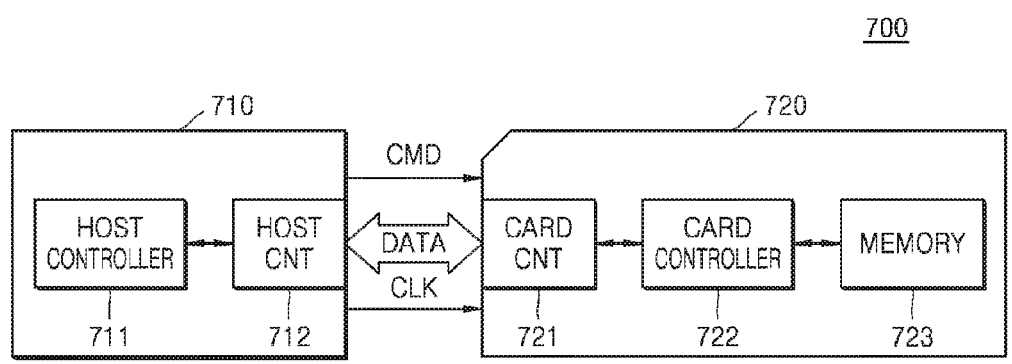
FIG. 20 is a block diagram of an example in which a memory system according to an exemplary embodiment is applied to a memory card system.

FIG. 20 is a block diagram of an example in which a memory system according to an exemplary embodiment is applied to a memory card system 700. The memory system is assumed to be a flash memory system.

Referring to FIG. 20, the memory card system 700 may include a host 710 and a memory card 720. The host 710 may include a host controller 711 and a host connector 712. The memory card 720 may include a card connector 721, a card controller 722, and a memory system 723. In this regard, the memory system 723 may be implemented by using the embodiments illustrated in FIGS. 1 through 19. Accordingly, the memory system 723 may include a memory controller and a flash memory device. Also, the memory system 723 may detect a program/erase cycle that is performed in response to a request from the host 710, and may change a setting value related to the number of times a program loop is performed or a setting value related to the number of times an erase loop is performed, based on a result of the detection. In addition, the memory system 723 may determine whether a write operation has passed or failed or whether an erase operation has passed or failed, based on a changed setting-value. A bad block management operation may be performed according to a result of the determination.

The host 710 may write data to the memory card 720 or read data stored in the memory card 720. The host controller 711 may transmit a command CMD, a clock signal CLK generated in a clock generator (not shown) in the host 710, and data DATA to the memory card 720 through the host connector 712.

In response to the command CMD received through the card connector 721, the card controller 722 may provide the memory system 723 with data in synchronization with a clock signal generated by a clock generator (not shown) in the card controller 722. The memory system 723 may store data transmitted from the host 710.

The memory card 720 may be a compact flash card (CFC), a Microdrive, a smart media card (SMC), a multi-media card (MMC), a security digital card (SDC), a universal flash storage (UFS), a memory stick, or a universal serial bus (USB) flash memory driver.

Figure 21:
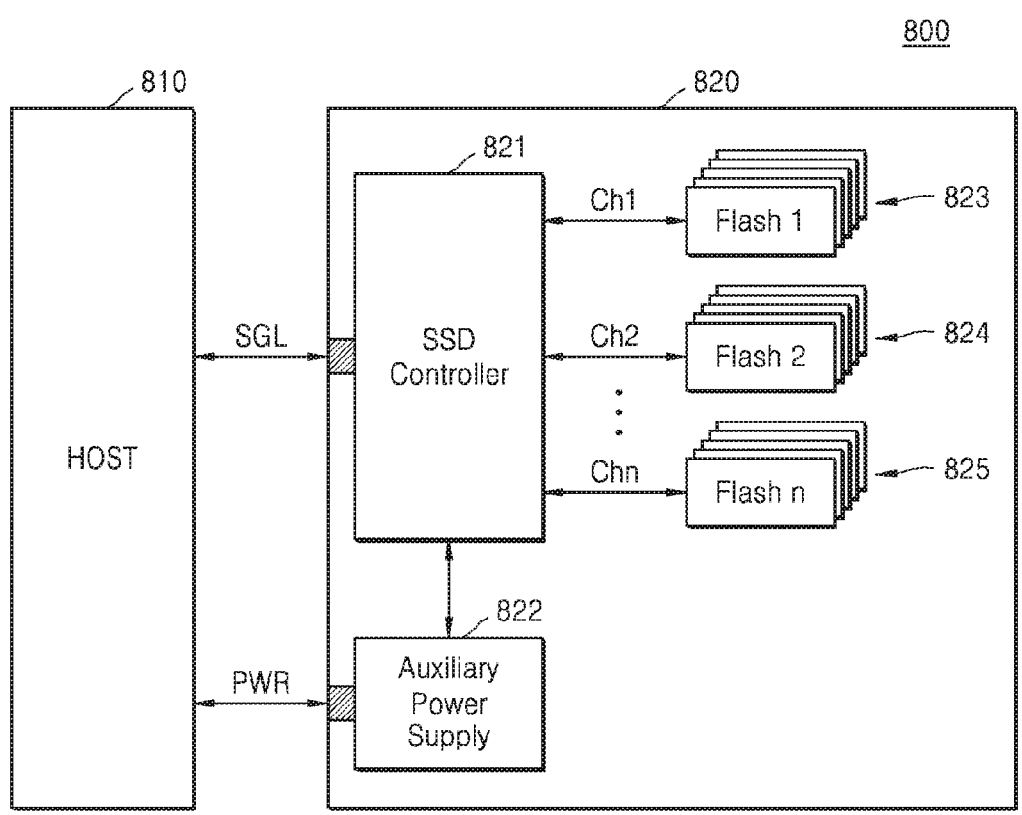
FIG. 21 is a block diagram of an example in which a memory system according to an exemplary embodiment is applied to a solid state disk (SSD) system.

FIG. 21 is a block diagram of an example in which a memory system according to an exemplary embodiment is applied to a solid state disk (SSD) system 800.

Referring to FIG. 21, the SSD system 800 may include a host 810 and an SSD 820. The SSD 820 may transmit and receive a signal to and from the host 810 via a signal connector, and may receive power via a power connector. The SSD 820 may include an SSD controller 821, an auxiliary power supply 822, and a plurality of memory systems 823, 824, and 825. Each of the memory systems 823, 824, and 825 may include a memory controller and a flash memory device. According to an exemplary embodiment, each of the memory system 823, 824, and 825 may detect a program/erase cycle that is performed in response to a request from the host 810, and may change a setting value related to the number of times a program loop is performed or a setting value related to the number of times an erase loop is performed, based on a result of the detection. In addition, each of the memory systems 823, 824, and 825 may determine whether a write operation has passed or failed or whether an erase operation has passed or failed, based on a changed setting-value. A bad block management operation may be performed according to a result of the determination.

Figure 22:
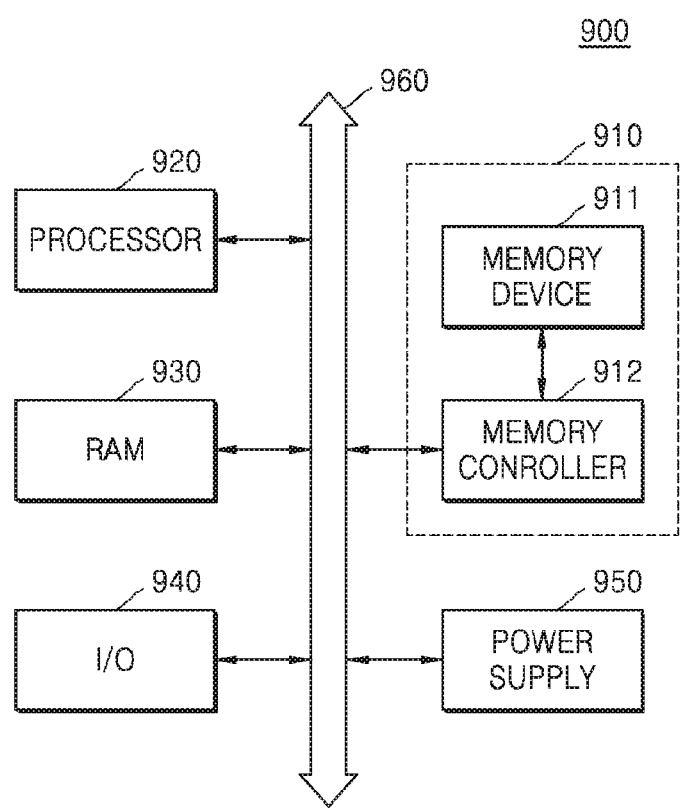
FIG. 22 is a block diagram of a computing system including a memory system according to an exemplary embodiment.

FIG. 22 is a block diagram of a computing system 900 including a memory system according to exemplary embodiments.

Referring to FIG. 22, the computing system 900 may include a memory system 910, a processor 920, a RAM 930, an input/output device 940, and a power supply 950. The memory system 910 may include a memory device 911 and a memory controller 912. Although not illustrated in FIG. 22, the computing system 900 may further include ports via which to communicate with a video card, a sound card, a memory card, a USB device, or other electronic appliances. The computing system 900 may be a personal computer or a portable electronic device such as a laptop computer, a mobile phone, a personal digital assistant (PDA) or a camera.

The processor 920 may perform particular computations or tasks. According to an exemplary embodiment, the processor 920 may be a micro-processor or a central processing unit (CPU). The processor 920 may perform communication with the RAM 930, the input/output device 940, and the memory system 910 via a bus 960 such as an address bus, a control bus, or a data bus. The memory system 910 may be implemented by using a memory device of the exemplary embodiments illustrated in FIGS. 1 through 19.

According to an exemplary embodiment, the processor 920 may also be connected to an extension bus such as a peripheral component interconnect (PCI) bus.

The RAM 930 may store data needed in operating the computing system 900. The RAM 830 may be a DRAM, a mobile DRAM, an SRAM, a PRAM, a ferroelectric RAM (FeRAM), a magnetic RAM (MRAM), a resistive RAM (RRAM), etc.

The input/output device 940 may include an input unit such as a keyboard, a keypad, or a mouse, and an output unit such as a printer or a display. The power supply 950 may supply an operating voltage needed in operating the computing system 900.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to exemplary embodiments thereof, it will be understood that various changes in form and details may be made therein without departing from the spirit and scope of the following claims.

What is claimed is:

1. A method of operating a flash memory device, the method comprising:
   detecting a number of program/erase cycles that have been executed by the flash memory device;
   changing, in accordance with the detected number of program/erase cycles, a maximum value of a number of times a program loop is executed, wherein the maximum value of the number of times the program loop is executed decreases as the number of executed program/erase cycles increases;
   programming data within the flash memory device by executing the program loop one or more times, in response to receiving a write command; and
   determining whether the programming has passed or failed, based on whether a number of program loops required to program the data within the flash memory device is within a range bounded by the changed maximum value.

2. The method of claim 1, wherein the programming passes when the programming of the data within the flash memory device is completed with an executed number of program loops that is within the range bounded by the changed maximum value.

3. The method of claim 1, wherein a block comprising a write-requested page is processed as a bad block when the programming is determined to have failed for the write-requested page.

4. The method of claim 1, wherein the detecting of the number of program/erase cycles comprises:
   generating a count value by performing a count operation in response to a reception of a write/erase command; and
   determining a timing for changing the maximum value, by comparing the count value with a reference value.

5. The method of claim 1, wherein the changing of the maximum value comprises referring to a look-up table comprising table information related to a result of the detecting and the number of times the program loop is performed.

6. The method of claim 1, further comprising:
   changing, in accordance with the detected number of program/erase cycles, a maximum erase value of a number of times an erase loop is executed;
   erasing data within the flash memory device by executing the erase loop one or more times, in response to receiving an erase command; and
   determining whether the erasing has passed or failed, based on whether a number of erase loops required to erase the data within the flash memory device is within a range bounded by the changed maximum erase value.

7. The method of claim 6, wherein an erase-requested block is processed as a bad block when the erasing is determined to have failed for the erase-requested block.

8. The method of claim 1, wherein:
   the flash memory device comprises a plurality of memory chips and each of the memory chips comprises a plurality of cell regions, and
   the maximum value is set differently for each memory chip or is set differently for each cell region.

9. The method of claim 1, wherein the changing of the maximum value is further based on at least one selected from:
   a detected temperature of the flash memory device; and
   at least one of a detected voltage and a detected current that is transmitted to a word line of the flash memory device.

10. A method of operating a memory system comprising a memory controller and a memory device, the method comprising:
    performing a first memory operation including program loops or erase loops to program or erase data;
    detecting a number of program/erase cycles that have been executed by the memory device;
    changing a maximum number of loops of a program operation or an erase operation into N, according to the detected number of program/erase cycles (N is an integer of 1 or greater);
    performing a second memory operation including program loops or erase loops to program or erase data without exceeding the changed maximum number of loops;
    determining whether the second memory operation has passed or failed, based on the changed, maximum number of loops; and
    managing a cell region, for which the second memory operation is requested, as a bad region if the second memory operation is determined to have failed, wherein:
    when it is determined that the first memory operation has failed after an Nth program loop or erase loop is performed, an (N+1)th program loop or erase loop is further performed, and
    when it is determined that the second memory operation has failed after an Nth program loop or erase loop is performed, the cell region is managed as the bad region.

11. The method of claim 10, wherein as the number of program/erase cycles increases, the maximum number of loops of the program operation gradually decreases and the maximum number of loops of the erase operation gradually increases.

12. The method of claim 10, wherein:
    the second memory operation comprises a program operation corresponding to a write command and an erase operation corresponding to an erase command, and
    a block comprising a program-failed page and an erase-failed block are managed as bad blocks.

13. The method of claim 10, wherein:
    the detected number of program/erase cycles is provided to the memory controller, and
    in an initial driving of the memory system, the memory controller refers to a look-up table comprising information related to the detected number of program/erase cycles and a number of times a program loop is performed and communicates a setting of the maximum number of loops to the memory device.

14. A method executed by a nonvolatile memory device of programming or erasing data within the nonvolatile memory device, the method comprising:

selecting an upper boundary of program or erase loops that varies in accordance with a parameter of the nonvolatile memory device;

executing operational loops for programming or erasing data within the nonvolatile memory device; and determining whether the data is successfully programmed or erased within the nonvolatile memory device through a number of the executed operational loops that is within the selected upper boundary, wherein for a circumstance in which the operational loops are executed for programming data within the nonvolatile memory device, the upper boundary decreases as a number of executed program and erase cycles increases.

15. The method of claim 14, wherein the parameter is a number of executed program and erase cycles that have been executed by the nonvolatile memory device.

16. The method of claim 14, wherein the parameter is a time required for the nonvolatile memory device to perform an operation or a temperature of the nonvolatile memory device.

17. The method of claim 15, wherein for a circumstance in which the operational loops are executed for erasing data within the nonvolatile memory device, the upper boundary increases as a number of executed program and erase cycles increases.

18. The method of claim 14, wherein the parameter is a detected current that is transmitted to a word line of the nonvolatile memory device.

\* \* \* \* \*